(12) United States Patent
Henley et al.

(10) Patent No.: US 7,371,660 B2
(45) Date of Patent: May 13, 2008

(54) CONTROLLED CLEAVING PROCESS

(75) Inventors: Francois J. Henley, Los Gatos, CA (US); Nathan W. Cheung, Albany, CA (US)

(73) Assignee: Silicon Genesis Corporation, San Jose, CA (US)

( * ) Notice: Subject to any disclaimer, the term of this patent is extended or adjusted under 35 U.S.C. 154(b) by 0 days.

(21) Appl. No.: 11/281,042

(22) Filed: Nov. 16, 2005

(65) Prior Publication Data

US 2006/0141747 A1  Jun. 29, 2006

Related U.S. Application Data

(63) Continuation of application No. 10/644,644, filed on Aug. 19, 2003, now Pat. No. 7,160,790, which is a continuation of application No. 09/483,393, filed on Jan. 13, 2000, now Pat. No. 6,632,724, which is a continuation of application No. 09/026,034, filed on Feb. 19, 1998, now Pat. No. 6,013,563.

(60) Provisional application No. 60/046,276, filed on May 12, 1997.

(51) Int. Cl.
*H01L 21/30* (2006.01)
*H01L 21/46* (2006.01)

(52) U.S. Cl. ............... 438/455; 438/528; 438/458; 438/459

(58) Field of Classification Search ........... 438/455, 438/528, 458, 459
See application file for complete search history.

(56) References Cited

U.S. PATENT DOCUMENTS

| | | | |
|---|---|---|---|
| 2,614,055 A | 10/1952 | Senarelens | |
| 3,117,022 A | 1/1964 | Bronson et al. | |
| 3,225,820 A | 12/1965 | Riordan | |
| 3,390,033 A | 6/1968 | Brown | |
| 3,551,213 A | 12/1970 | Boyle | |
| 3,770,499 A | 11/1973 | Crowe et al. | |
| 3,786,359 A | 1/1974 | King | |

(Continued)

FOREIGN PATENT DOCUMENTS

DE    834363    3/1952

(Continued)

OTHER PUBLICATIONS

Alles, Michael et al., "Thin Film Silicon on Insulator: An Enabling Technology," *Semiconductor International*, pp. 67-72 (1997).

(Continued)

*Primary Examiner*—Hsien-Ming Lee
(74) *Attorney, Agent, or Firm*—Townsend and Townsend and Crew LLP

(57) ABSTRACT

A technique for forming a film of material (12) from a donor substrate (10). The technique has a step of introducing energetic particles (22) through a surface of a donor substrate (10) to a selected depth (20) underneath the surface, where the particles have a relatively high concentration to define a donor substrate material (12) above the selected depth. An energy source is directed to a selected region of the donor substrate to initiate a controlled cleaving action of the substrate (10) at the selected depth (20), whereupon the cleaving action provides an expanding cleave front to free the donor material from a remaining portion of the donor substrate.

56 Claims, 10 Drawing Sheets

U.S. PATENT DOCUMENTS

| | | | |
|---|---|---|---|
| 3,806,380 A | 4/1974 | Kitada et al. | |
| 3,832,219 A | 8/1974 | Nelson et al. | |
| 3,900,636 A | 8/1975 | Curry et al. | |
| 3,901,423 A | 8/1975 | Hillberry et al. | |
| 3,915,757 A | 10/1975 | Engel | |
| 3,946,334 A | 3/1976 | Yonezu et al. | |
| 3,957,107 A | 5/1976 | Altoz et al. | |
| 3,993,909 A | 11/1976 | Drews et al. | |
| 4,006,340 A | 2/1977 | Gorinas | |
| 4,039,416 A | 8/1977 | White | |
| 4,053,335 A | 10/1977 | Hu | |
| 4,074,139 A | 2/1978 | Pankove | |
| 4,107,350 A | 8/1978 | Berg et al. | |
| 4,108,751 A | 8/1978 | King | |
| 4,116,751 A | 9/1978 | Zaromb | |
| 4,121,334 A | 10/1978 | Wallis | |
| 4,139,858 A * | 2/1979 | Pankove | 136/256 |
| 4,170,662 A | 10/1979 | Weiss et al. | |
| 4,216,906 A | 8/1980 | Olsen et al. | |
| 4,237,601 A | 12/1980 | Woolhouse et al. | |
| 4,244,348 A | 1/1981 | Wilkes | |
| 4,252,837 A | 2/1981 | Auton | |
| 4,255,208 A | 3/1981 | Deutscher et al. | |
| 4,274,004 A | 6/1981 | Kanai | |
| 4,342,631 A | 8/1982 | White et al. | |
| 4,346,123 A | 8/1982 | Kaufmann | |
| 4,361,600 A | 11/1982 | Brown | |
| 4,368,083 A | 1/1983 | Bruel et al. | |
| 4,375,125 A | 3/1983 | Byatt | |
| 4,412,868 A | 11/1983 | Brown et al. | |
| 4,452,644 A | 6/1984 | Bruel et al. | |
| 4,468,309 A | 8/1984 | White | |
| 4,471,003 A | 9/1984 | Cann | |
| 4,486,247 A | 12/1984 | Ecer et al. | |
| 4,490,190 A | 12/1984 | Speri | |
| 4,500,563 A | 2/1985 | Ellenberger et al. | |
| 4,508,056 A | 4/1985 | Bruel et al. | |
| 4,536,657 A | 8/1985 | Bruel | |
| 4,539,050 A | 9/1985 | Kramler et al. | |
| 4,566,403 A | 1/1986 | Fournier | |
| 4,567,505 A | 1/1986 | Pease et al. | |
| 4,568,563 A | 2/1986 | Jackson et al. | |
| 4,585,945 A | 4/1986 | Bruel et al. | |
| 4,645,546 A | 2/1987 | Matsushita | |
| 4,684,535 A | 8/1987 | Heinecke et al. | |
| 4,704,302 A | 11/1987 | Bruel et al. | |
| 4,706,377 A | 11/1987 | Shuskus | |
| 4,717,683 A | 1/1988 | Parrillo et al. | |
| 4,727,047 A | 2/1988 | Bozler et al. | |
| 4,764,394 A | 8/1988 | Conrad | |
| 4,766,086 A | 8/1988 | Ohshima et al. | |
| 4,837,172 A | 6/1989 | Mizuno et al. | |
| 4,846,928 A | 7/1989 | Dolins et al. | |
| 4,847,792 A | 7/1989 | Barna et al. | |
| 4,853,250 A | 8/1989 | Boulos et al. | |
| 4,883,561 A | 11/1989 | Gmitter et al. | |
| 4,887,005 A | 12/1989 | Rough et al. | |
| 4,891,329 A | 1/1990 | Reisman et al. | |
| 4,894,709 A | 1/1990 | Phillips et al. | |
| 4,931,405 A | 6/1990 | Kamijo et al. | |
| 4,948,458 A | 8/1990 | Ogle | |
| 4,952,273 A | 8/1990 | Popov | |
| 4,956,693 A | 9/1990 | Sawahata et al. | |
| 4,960,073 A | 10/1990 | Suzuki et al. | |
| 4,982,090 A | 1/1991 | Wittmaack | |
| 4,983,251 A | 1/1991 | Haisma et al. | |
| 4,996,077 A | 2/1991 | Moslehi et al. | |
| 5,015,353 A | 5/1991 | Hubler et al. | |
| 5,034,343 A | 7/1991 | Rouse et al. | |
| 5,070,040 A | 12/1991 | Pankove | |
| 5,082,793 A | 1/1992 | Li | |
| 5,102,821 A | 4/1992 | Moslehi | |
| 5,110,748 A | 5/1992 | Sarma | |
| 5,133,826 A | 7/1992 | Dandl | |
| 5,162,241 A | 11/1992 | Mori et al. | |
| 5,196,355 A | 3/1993 | Wittkower | |
| 5,198,371 A | 3/1993 | Li | |
| 5,202,095 A | 4/1993 | Houchin et al. | |
| 5,203,960 A | 4/1993 | Dandl | |
| 5,206,749 A | 4/1993 | Zavracky et al. | |
| 5,213,451 A | 5/1993 | Frank | |
| 5,234,529 A | 8/1993 | Johnson | |
| 5,234,535 A | 8/1993 | Beyer et al. | |
| 5,242,861 A | 9/1993 | Inaba | |
| 5,250,328 A | 10/1993 | Otto | |
| 5,252,178 A | 10/1993 | Moslehi | |
| 5,256,562 A | 10/1993 | Vu et al. | |
| 5,258,320 A | 11/1993 | Zavracky et al. | |
| 5,258,325 A | 11/1993 | Spitzer et al. | |
| 5,269,880 A | 12/1993 | Jolly et al. | |
| 5,273,610 A | 12/1993 | Thomas, III et al. | |
| 5,277,748 A | 1/1994 | Sakaguchi et al. | |
| 5,303,574 A | 4/1994 | Matossian et al. | |
| 5,304,509 A | 4/1994 | Sopori | |
| 5,308,776 A | 5/1994 | Gotou | |
| 5,317,236 A | 5/1994 | Zavracky et al. | |
| 5,342,472 A | 8/1994 | Imahashi et al. | |
| 5,344,524 A | 9/1994 | Sharma et al. | |
| 5,354,381 A | 10/1994 | Sheng | |
| 5,362,671 A | 11/1994 | Zavracky et al. | |
| 5,363,603 A | 11/1994 | Miller et al. | |
| 5,368,710 A | 11/1994 | Chen et al. | |
| 5,370,765 A | 12/1994 | Dandl | |
| 5,374,564 A * | 12/1994 | Bruel | 438/455 |
| 5,376,560 A | 12/1994 | Aronowitz et al. | |
| 5,377,031 A | 12/1994 | Vu et al. | |
| 5,404,079 A | 4/1995 | Ohkuni et al. | |
| 5,405,480 A | 4/1995 | Benzing et al. | |
| 5,411,592 A | 5/1995 | Ovshinsky et al. | |
| 5,413,679 A | 5/1995 | Godbey | |
| 5,435,880 A | 7/1995 | Minato et al. | |
| 5,438,241 A | 8/1995 | Zavracky et al. | |
| 5,443,661 A | 8/1995 | Oguro et al. | |
| 5,444,557 A | 8/1995 | Spitzer et al. | |
| 5,459,016 A | 10/1995 | Debe et al. | |
| 5,475,514 A | 12/1995 | Salerno et al. | |
| 5,476,691 A | 12/1995 | Komvopoulos et al. | |
| 5,480,842 A | 1/1996 | Clifton et al. | |
| 5,487,785 A | 1/1996 | Horiike et al. | |
| 5,494,835 A | 2/1996 | Bruel | |
| 5,504,328 A | 4/1996 | Bonser | |
| 5,528,397 A | 6/1996 | Zavracky et al. | |
| 5,539,245 A | 7/1996 | Imura et al. | |
| 5,558,718 A | 9/1996 | Leung | |
| 5,559,043 A | 9/1996 | Bruel | |
| 5,569,620 A | 10/1996 | Linn et al. | |
| 5,581,385 A | 12/1996 | Spitzer et al. | |
| 5,585,304 A | 12/1996 | Hayashi et al. | |
| 5,611,855 A | 3/1997 | Wijaranakula | |
| 5,643,834 A | 7/1997 | Harada et al. | |
| 5,653,811 A | 8/1997 | Chan | |
| 5,705,421 A | 1/1998 | Matsushita et al. | |
| 5,710,057 A | 1/1998 | Kenney | |
| 5,714,395 A | 2/1998 | Bruel | |
| 5,744,852 A | 4/1998 | Linn et al. | |
| 5,753,560 A | 5/1998 | Hong et al. | |
| 5,755,914 A | 5/1998 | Yonehara | |
| 5,763,319 A | 6/1998 | Ling et al. | |
| 5,783,022 A | 7/1998 | Cha et al. | |
| 5,804,086 A | 9/1998 | Bruel | |
| 5,821,158 A | 10/1998 | Shishiguchi | |
| 5,824,595 A | 10/1998 | Igel et al. | |
| 5,827,751 A | 10/1998 | Nuyen | |
| 5,840,590 A | 11/1998 | Myers, Jr. et al. | |

| | | | |
|---|---|---|---|
| 5,854,123 A | 12/1998 | Sato et al. | |
| 5,863,830 A | 1/1999 | Bruel et al. | |
| 5,869,387 A | 2/1999 | Sato et al. | |
| 5,877,070 A | 3/1999 | Goesele et al. | |
| 5,882,987 A | 3/1999 | Srikrishnan | |
| 5,909,627 A | 6/1999 | Egloff | |
| 5,920,764 A | 7/1999 | Hanson et al. | |
| 5,953,622 A | 9/1999 | Lee et al. | |
| 5,966,620 A | 10/1999 | Sakaguchi et al. | |
| 5,985,742 A | 11/1999 | Henley et al. | |
| 5,993,677 A | 11/1999 | Biasse et al. | |
| 5,994,207 A | 11/1999 | Henley et al. | |
| 6,010,579 A | 1/2000 | Henley et al. | |
| 6,013,563 A | 1/2000 | Henley et al. | |
| 6,020,252 A | 2/2000 | Aspar et al. | |
| 6,033,974 A | 3/2000 | Henley et al. | |
| 6,048,411 A | 4/2000 | Henley et al. | |
| 6,077,383 A | 6/2000 | Laporte | |
| 6,083,324 A | 7/2000 | Henley | |
| 6,120,597 A | 9/2000 | Levy et al. | |
| 6,150,239 A | 11/2000 | Goesele et al. | |
| 6,159,824 A | 12/2000 | Henley et al. | |
| 6,171,965 B1 | 1/2001 | Kang et al. | |
| 6,184,111 B1 | 2/2001 | Henley et al. | |
| 6,190,998 B1 | 2/2001 | Bruel et al. | |
| 6,191,007 B1 | 2/2001 | Matsui et al. | |
| 6,214,701 B1 | 4/2001 | Matsushita et al. | |
| 6,225,192 B1 | 5/2001 | Aspar et al. | |
| 6,294,478 B1 * | 9/2001 | Sakaguchi et al. | 438/753 |
| 6,376,806 B2 | 4/2002 | Yoo | |
| 6,911,376 B2 | 6/2005 | Yoo | |

FOREIGN PATENT DOCUMENTS

| | | |
|---|---|---|
| EP | 084 287 A1 | 7/1983 |
| EP | 099 778 A1 | 2/1984 |
| EP | 155 875 A1 | 2/1984 |
| EP | 164 281 A1 | 12/1985 |
| EP | 0112 230 A1 | 4/1987 |
| EP | 112 230 A1 | 4/1987 |
| EP | 181 249 A1 | 6/1989 |
| EP | 181249 | 6/1989 |
| EP | 504714 | 9/1992 |
| EP | 533551 | 3/1993 |
| EP | 355913 | 12/1993 |
| EP | 660140 | 6/1995 |
| EP | 665587 | 8/1995 |
| EP | 665588 | 8/1995 |
| EP | 379828 | 9/1995 |
| EP | 459177 | 12/1995 |
| EP | 703609 | 3/1996 |
| EP | 763849 | 3/1997 |
| EP | 807 970 A1 | 11/1997 |
| EP | 867921 | 3/1998 |
| EP | 0867 917 A2 | 9/1998 |
| EP | 961 312 A2 | 12/1999 |
| FR | 1558881 | 1/1969 |
| FR | 2261802 | 2/1974 |
| FR | 2235474 | 4/1974 |
| FR | 2298880 | 1/1975 |
| FR | 2266304 | 4/1975 |
| FR | 2519437 | 1/1982 |
| FR | 2529383 | 6/1982 |
| FR | 2537768 | 8/1982 |
| FR | 2537777 | 12/1982 |
| FR | 2715502 | 1/1984 |
| FR | 2560426 | 2/1984 |
| FR | 2563377 | 4/1984 |
| FR | 2575601 | 12/1984 |
| FR | 2681472 | 9/1991 |
| FR | 2714524 | 12/1993 |
| FR | 2715501 | 1/1994 |
| FR | 2715503 | 1/1994 |
| FR | 2720189 | 5/1994 |
| FR | 2725074 | 9/1994 |
| GB | 2221991 | 7/1989 |
| GB | 2 231 197 A | 11/1990 |
| JP | 60-235434 | 11/1958 |
| JP | 53-104156 | 9/1978 |
| JP | 58-144475 | 8/1983 |
| JP | 60-83591 | 10/1983 |
| JP | 59-19394 | 1/1984 |
| JP | 59-46750 | 3/1984 |
| JP | 59-54217 | 3/1984 |
| JP | 59-114744 | 7/1984 |
| JP | 59-139539 | 8/1984 |
| JP | 59-193904 | 11/1984 |
| JP | 60-207237 | 10/1985 |
| JP | 4-76503 | 7/1990 |
| JP | 3-109731 A | 5/1991 |
| JP | 3-132055 A | 6/1991 |
| JP | 3-265156 A | 11/1991 |
| JP | 2901031 | 1/1992 |
| JP | 2910001 | 1/1992 |
| JP | 4-246594 | 9/1992 |
| JP | 4-298023 | 10/1992 |
| JP | 5-211128 | 8/1993 |
| JP | 07-164728 | 6/1995 |
| JP | 7-215800 | 8/1995 |
| JP | 7-254690 | 10/1995 |
| JP | 7-263291 | 10/1995 |
| JP | 8-97389 | 4/1996 |
| JP | 28-077800 | 3/1998 |
| JP | 10-200080 A | 7/1998 |
| JP | 11-045840 A | 2/1999 |
| JP | 2000-94317 | 4/2000 |
| WO | WO 95/10718 | 4/1995 |
| WO | WO 95/20824 | 4/1995 |
| WO | WO 95/31825 | 11/1995 |
| WO | WO 99/35674 | 7/1999 |
| WO | WO99-35674 | 7/1999 |

OTHER PUBLICATIONS

Basta, Nicholas, "Ion-Beam Implantation," *High Technology*, (1985).

Burggraff, Peter, "Advanced Plasma Source: What's Working?" *Semiconductor International*, pp. 56-59 (May 1994).

Carter et al., "The Collection of Ions Implanted in Semiconductors II. Range distributions Derived from Collection and Sputter-Etch Curves," *Radiation Effects*, 16:107-114 (1972).

Garter, G. et al., "The Collection of Ions Implanted in Semiconductors Radiation Effects," Abstract only, vol. 16, No. 1-2, pp. 107-114 (Sep. 1972).

Cassidy, Victor M., "Ion Implantation Process Toughens Metalworking Tools," *Modern Metals*, pp. 65-67 (1984).

Cheung, N.W., "Plasma Immersion Ion Implantation for Semiconductor Processing," *Material Chemistry and Physics*, 46(2-3): 132-139 (1996).

Choyke et al., "Mechanical Response of Single Crystal SI to very High Fluence H+ Implantation," *Nuc. Instr. Meth.*, 209-210:407-412 (1983).

Choyke et al., "Implanted Hydrogen Effects at High Concentrations in Model Low Z Shielding Materials," *J. Nuc. Mtrls.*, 122-23:1585-86 (1984).

Choyke et al., "A Comparative Study of Near-Surface Effects Due to Very High Fluence H+ Implantation in Single Crystal FZ, OZ, and Web SI," *Mat. Res. Soc. Symp. Proc.*, 27:359-364 (1984).

Chu, P.K. et al. "Plasma Immersion Ion Implantation—A Fledgling Technique for Semiconductor Processing," *Materials Science and Engineering Reports: A Review Journal*, R17(6-7): 207-280 (1996).

Corbett et al., "Embrittlement of Materials: Si(H) as a Model System," *J. Nuc. Mtrls.*, 169: 179-184 (1984).

Grovenor, C.R.M., *Microelectronic Materials*, pp. 73-75 (1989).

Hulett, D.M., et al., "Ion Nitriding and Ion Implantation: A Comparison," *Metal Progress*, pp. 18-21 (1985).

I.B.M. *Technical Disclosure Bulletin*, vol. 29: No. 3, p. 1416 (Aug. 1986).

Johnson et al., "Hydrogen-Induced Platelets in Silicon: Separation of Nucleation and Growth," *Mtrls. Sci. Forum*, 83-87:33-38 (1992).

Li, J., "Novel Semiconductor Substrate Formed by Hydrogen Ion Implantation into Silicon," *Appl. Phys. Lett.*, 55(21):2223-2224 (1989).

Lu, X. et al., "SOI Material Technology Using Plasma Immersion Ion Implantation," *Proceedings 1996 IEEE International SOI Conference* (Oct. 1996).

Mahajan et al., *Principles of Growth and Processing of Semiconductors*, WCB McGraw-Hill, chapter 6, pp. 262-269.

Matsuda et al., "Large Diameter Ion Beam Implantation System," *Nuclear Instruments and Methods*, B21:314-316 (1987).

Milnes et al., "Peeled Film Technology for solar Cells," pp. 338-341.

Moreau, Wayne M., *Semiconductor Lithography, Principles, Practices, and Materials*, Plenum Press (1988).

Oshima et al., "Defects in Si irradiated with D-T neutrons, D and He ions," *J. Nuc. Mtrls.*, 179-181:947-950 (1991).

Patent Abstracts of Japan, vol. 7, No. 107 (E-174), (May 11, 1993) JP-58-030145 (Feb. 22, 1983).

Renier, M., et al., "A New Low-Energy Ion Implanter for Bombardment of Cylindrical Surfaces," Vacuum, 35(12):577-578 (1985).

Sioshansi, Piran, "Ion Beam Modification of Materials for Industry," *Thin Solid Film*, 118:61-71 (1984).

Smith, D.L., *Thin-Film Deposition*, McGraw-Hill, Inc., pp. 185-196, 278-293.

Sze, S.M., *VLSI Technology*, 2nd Edition, pp. 9-10, (1988).

Tong et al., "A 'smarter-cut' approach to low temperature silicon layer transfer," *Appl. Phys. Lett.*, 72(1):49-51 (1998).

Tong et al., *Semiconductor Wafer Bonding: Science and Technology*, John Wiley & Sons, Inc., pp. 152-171.

Wolf, Stanley Ph.D., *Silicon Processing for the VLSI Era* v, ol. 2, pp. 66-79, Lattice Press (1990).

U.S. Dept. of Energy, "The Fusion Connection", *Plasma Coating*, pp. 6-7 (1985).

Veldkamp, W.B. et al., Binary Optics, *Scientific American*, pp. 50-55 (May 1992).

B.N. Mukashev et al., *Hydrogen Implantation into Silicon: Infra-Red Absorption Spectra and Electrical Properties*, Institute of High Energy Physics, Academy of Sciences of the Kazakh SSR, Alma-Ata1; 91, 509 (1985).

* cited by examiner

CONTROLLED CLEAVING PROCESS

CROSS REFERENCE TO RELATED APPLICATIONS

This application is a continuation of U.S. application Ser. No. 10/644,644, filed on Aug. 19, 2003, now U.S. Pat. No. 7,160,790 which is a continuation of U.S. application Ser. No. 09/483,393, filed Jan. 13, 2000, now U.S. Pat. No. 6,632,724 which is a continuation of U.S. application Ser. No. 09/026,034 filed Feb. 19, 1998, now U.S. Pat. No. 6,013,563 which claims priority from the provisional patent application entitled A CONTROLLED CLEAVAGE PROCESS AND RESULTING DEVICE, filed May 12, 1997 and assigned Application Ser. No. 60/046,276, the disclosure of which is hereby incorporated in its entirety for all purposes.

BACKGROUND OF THE INVENTION

The present invention relates to the manufacture of substrates. More particularly, the invention provides a technique including a method and device for cleaving a substrate in the fabrication of a silicon-on-insulator substrate for semiconductor integrated circuits, for example. But it will be recognized that the invention has a wider range of applicability; it can also be applied to other substrates for multi-layered integrated circuit devices, three-dimensional packaging of integrated semiconductor devices, photonic devices, piezoelectronic devices, microelectromechanical systems ("MEMS"), sensors, actuators, solar cells, flat panel displays (e.g., LCD, AMLCD), biological and biomedical devices, and the like.

Craftsmen or more properly crafts-people have been building useful articles, tools, or devices using less useful materials for numerous years. In some cases, articles are assembled by way of smaller elements or building blocks. Alternatively, less useful articles are separated into smaller pieces to improve their utility. A common example of these articles to be separated include substrate structures, such as a glass plate, a diamond, a semiconductor substrate, and others.

These substrate structures are often cleaved or separated using a variety of techniques. In some cases, the substrates can be separated using a saw operation. The saw operation generally relies upon a rotating blade or tool, which cuts through the substrate material to separate the substrate material into two pieces. This technique, however, is often extremely "rough" and cannot generally be used for providing precision separations in the substrate for the manufacture of fine tools and assemblies. Additionally, the saw operation often has difficulty separating or cutting extremely hard and/or brittle materials, such as diamond or glass.

Accordingly, techniques have been developed to separate these hard and/or brittle materials using cleaving approaches. In diamond cutting, for example, an intense directional thermal/mechanical impulse is directed preferentially along a crystallographic plane of a diamond material. This thermal/mechanical impulse generally causes a cleave front to propagate along major crystallographic planes, where cleaving occurs when an energy level from the thermal/mechanical impulse exceeds the fracture energy level along the chosen crystallographic plane.

In glass cutting, a scribe line using a tool is often impressed in a preferred direction on the glass material, which is generally amorphous in character. The scribe line causes a higher stress area surrounding the amorphous glass material. Mechanical force is placed on each side of the scribe line, which increases stress along the scribe line until the glass material fractures, preferably along the scribe line. This fracture completes the cleaving process of the glass, which can be used in a variety of applications, including households.

Although the techniques described above are satisfactory, for the most part, as applied to cutting diamonds or household glass, they have severe limitations in the fabrication of small complex structures or precision workpieces. For instance, the above techniques are often "rough" and cannot be used with great precision in fabrication of small and delicate machine tools, electronic devices, or the like. Additionally, the above techniques may be useful for separating one large plane of glass from another, but are often ineffective for splitting off, shaving, or stripping a thin film of material from a larger substrate. Furthermore, the above techniques may often cause more than one cleave front, which join along slightly different planes, which is highly undesirable for precision cutting applications.

From the above, it is seen that a technique for separating a thin film of material from a substrate which is cost effective and efficient is desirable.

SUMMARY OF THE INVENTION

According to the present invention, an improved technique for removing a thin film of material from a substrate using a controlled cleaving action is provided. This technique allows an initiation of a cleaving process on a substrate using a single or multiple cleave region(s) through the use of controlled energy (e.g., spatial distribution) and selected conditions to allow an initiation of a cleave front(s) and to allow it to propagate through the substrate to remove a thin film of material from the substrate.

In a specific embodiment, the present invention provides a process for forming a film of material from a donor substrate using a controlled cleaving process. The process includes a step of introducing energetic particles (e.g., charged or neutral molecules, atoms, or electrons having sufficient kinetic energy) through a surface of a donor substrate to a selected depth underneath the surface, where the particles are at a relatively high concentration to define a thickness of donor substrate material (e.g., thin film of detachable material) above the selected depth. To cleave the donor substrate material, the method provides energy to a selected region of the donor substrate to initiate a controlled cleaving action in the donor substrate, whereupon the cleaving action is made using a propagating cleave front(s) to free the donor material from a remaining portion of the donor substrate.

In most of the embodiments, a cleave is initiated by subjecting the material with sufficient energy to fracture the material in one region, causing a cleave front, without uncontrolled shattering or cracking. The cleave front formation energy ($E_c$) must often be made lower than the bulk material fracture energy ($E_{mat}$) at each region to avoid shattering or cracking the material. The directional energy impulse vector in diamond cutting or the scribe line in glass cutting are, for example, the means in which the cleave energy is reduced to allow the controlled creation and propagation of a cleave front. The cleave front is in itself a higher stress region and once created, its propagation requires a lower energy to further cleave the material from this initial region of fracture. The energy required to propagate the cleave front is called the cleave front propagation energy ($E_p$). The relationship can be expressed as:

$$E_c = E_p + [\text{cleave front stress energy}]$$

A controlled cleaving process is realized by reducing $E_p$ along a favored direction(s) above all others and limiting the available energy to below the $E_p$ of other undesired directions. In any cleave process, a better cleave surface finish occurs when the cleave process occurs through only one expanding cleave front, although multiple cleave fronts do work.

Numerous benefits are achieved over pre-existing techniques using the present invention. In particular, the present invention uses controlled energy and selected conditions to preferentially cleave a thin film of material from a donor substrate which includes multi-material sandwiched films. This cleaving process selectively removes the thin film of material from the substrate while preventing a possibility of damage to the film or a remaining portion of the substrate. Accordingly, the remaining substrate portion can be re-used repeatedly for other applications.

Additionally, the present invention uses a relatively low temperature during the controlled cleaving process of the thin film to reduce temperature excursions of the separated film, donor substrate, or multi-material films according to other embodiments. This lower temperature approach allows for more material and process latitude such as, for example, cleaving and bonding of materials having substantially different thermal expansion coefficients. In other embodiments, the present invention limits energy or stress in the substrate to a value below a cleave initiation energy, which generally removes a possibility of creating random cleave initiation sites or fronts. This reduces cleave damage (e.g., pits, crystalline defects, breakage, cracks, steps, voids, excessive roughness) often caused in preexisting techniques. Moreover, the present invention reduces damage caused by higher than necessary stress or pressure effects and nucleation sites caused by the energetic particles as compared to pre-existing techniques.

The present invention achieves these benefits and others in the context of known process technology. However, a further understanding of the nature and advantages of the present invention may be realized by reference to the latter portions of the specification and attached drawings.

DESCRIPTION OF THE SPECIFIC EMBODIMENT

The present invention provides a technique for removing a thin film of material from a substrate while preventing a possibility of damage to the thin material film and/or a remaining portion of the substrate. The thin film of material is attached to or can be attached to a target substrate to form, for example, a silicon-on-insulator wafer. The thin film of material can also be used for a variety of other applications. The invention will be better understood by reference to the Figs. and the descriptions below.

1. Controlled Cleaving Techniques

Figure 1:
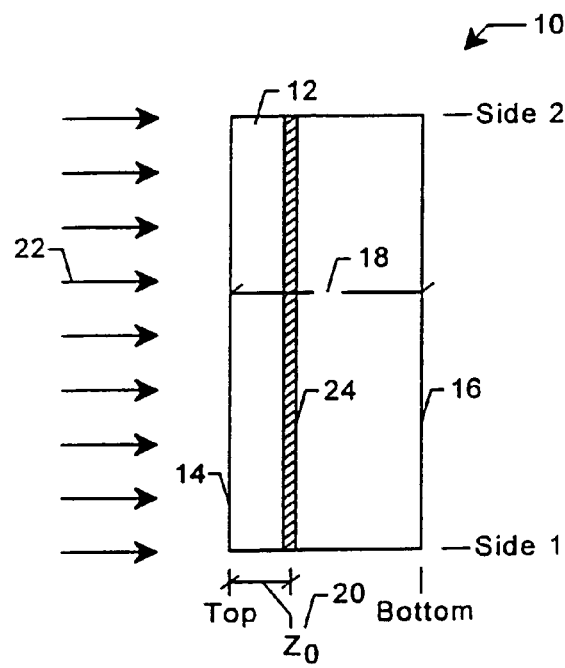
FIGS. 1-11 are simplified diagrams illustrating a controlled cleaving technique according to embodiments of the present invention.

FIG. 1 is a simplified cross-sectional view diagram of a substrate 10 according to the present invention. The diagram is merely an illustration and should not limit the scope of the claims herein. As merely an example, substrate 10 is a silicon wafer which includes a material region 12 to be removed, which is a thin relatively uniform film derived from the substrate material. The silicon wafer 10 includes a top surface 14, a bottom surface 16, and a thickness 18. Substrate 10 also has a first side (side 1) and a second side (side 2) (which are also referenced below in the Figs.). Material region 12 also includes a thickness 20, within the thickness 18 of the silicon wafer. The present invention provides a novel technique for removing the material region 12 using the following sequence of steps.

Selected energetic particles implant 22 through the top surface 14 of the silicon wafer to a selected depth 24, which defines the thickness 20 of the material region 12, termed the "thin film" of material. A variety of techniques can be used to implant the energetic particles into the silicon wafer. These techniques include ion implantation using, for example, beam line ion implantation equipment manufactured from companies such as Applied Materials, Eaton Corporation, Varian, and others. Alternatively, implantation occurs using a plasma immersion ion implantation ("PIII") technique. Examples of plasma immersion ion implantation techniques are described in "Recent Applications of Plasma Immersion Ion Implantation," Paul K. Chu, Chung Chan, and Nathan W. Cheung, SEMICONDUCTOR INTERNATIONAL, pp. 165-172, June 1996, and "Plasma Immersion Ion Implantation—A Fledgling Technique for Semiconductor Processing,", P. K. Chu, S. Qin, C. Chan, N. W. Cheung, and L. A. Larson, MATERIALS SCIENCE AND ENGINEERING REPORTS: A REVIEW JOURNAL, pp. 207-280, Vol. R17, Nos. 6-7, (Nov. 30, 1996), which are both hereby incorporated by reference for all purposes. Of course, techniques used depend upon the application.

Depending upon the application, smaller mass particles are generally selected to reduce a possibility of damage to the material region 12. That is, smaller mass particles easily travel through the substrate material to the selected depth without substantially damaging the material region that the particles traverse through. For example, the smaller mass particles (or energetic particles) can be almost any charged (e.g., positive or negative) and/or neutral atoms or molecules, or electrons, or the like. In a specific embodiment, the particles can be neutral and/or charged particles including ions such as ions of hydrogen and its isotopes, rare gas ions such as helium and its isotopes, and neon. The particles can also be derived from compounds such as gases, e.g., hydrogen gas, water vapor, methane, and hydrogen compounds, and other light atomic mass particles. Alternatively, the particles can be any combination of the above particles, and/or ions and/or molecular species and/or atomic species.

The particles generally have sufficient kinetic energy to penetrate through the surface to the selected depth underneath the surface.

Using hydrogen as the implanted species into the silicon wafer as an example, the implantation process is performed using a specific set of conditions. Implantation dose ranges from about $10^{15}$ to about $10^{18}$ atoms/cm$^2$, and preferably the dose is greater than about $10^{16}$ atoms/cm$^2$. Implantation energy ranges from about 1 KeV to about 1 MeV, and is generally about 50 KeV. Implantation temperature ranges from about −200 to about 600° C., and is preferably less than about 400° C. to prevent a possibility of a substantial quantity of hydrogen ions from diffusing out of the implanted silicon wafer and annealing the implanted damage and stress. The hydrogen ions can be selectively introduced into the silicon wafer to the selected depth at an accuracy of about +/−0.03 to +/−0.05 microns. Of course, the type of ion used and process conditions depend upon the application.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of the substrate at all internal locations is insufficient to initiate a non-reversible fracture (i.e., separation or cleaving) in the substrate material. It should be noted, however, that implantation does generally cause a certain amount of defects (e.g., micro-detects) in the substrate that can typically at least partially be repaired by subsequent heat treatment, e.g., thermal annealing or rapid thermal annealing.

Figure 2:
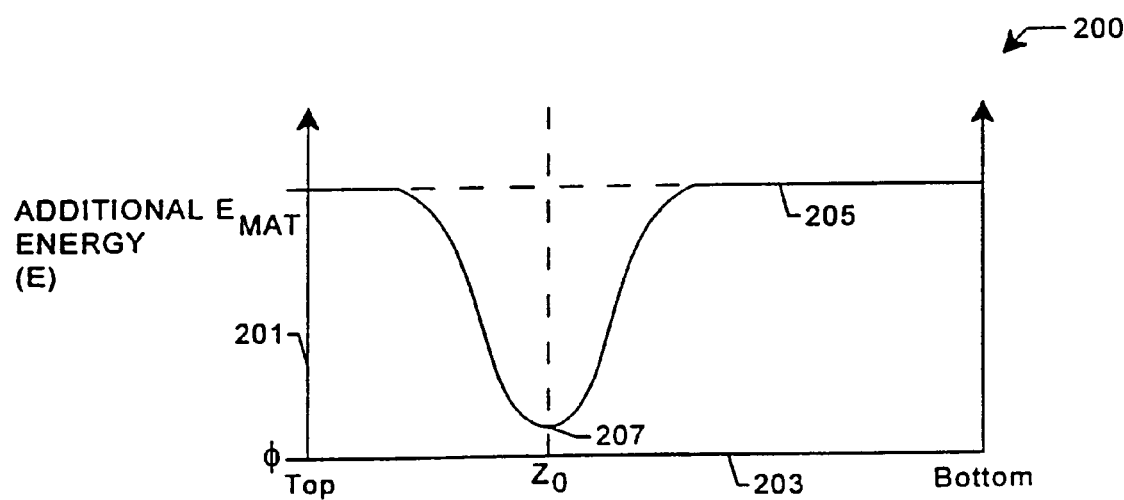

FIG. 2 is a simplified energy diagram 200 along a cross-section of the implanted substrate 10 according to the present invention. The diagram is merely an illustration and should not limit the scope of the claims herein. The simplified diagram includes a vertical axis 201 that represents an energy level (E) (or additional energy) to cause a cleave in the substrate. A horizontal axis 203 represents a depth or distance from the bottom of the wafer to the top of the wafer. After implanting particles into the wafer, the substrate has an average cleave energy represented as E 205, which is the amount of energy needed to cleave the wafer along various cross-sectional regions along the wafer depth. The cleave energy ($E_c$) is equal to the bulk material fracture energy ($E_{mat}$) in non-implanted regions. At the selected depth 20, energy ($E_{cz}$) 207 is lower since the implanted particles essentially break or weaken bonds in the crystalline structure (or increase stress caused by a presence of particles also contributing to lower energy ($E_{cz}$) 207 of the substrate) to lower the amount of energy needed to cleave the substrate at the selected depth. The present invention takes advantage of the lower energy (or increased stress) at the selected depth to cleave the thin film in a controlled manner.

Figure 3:
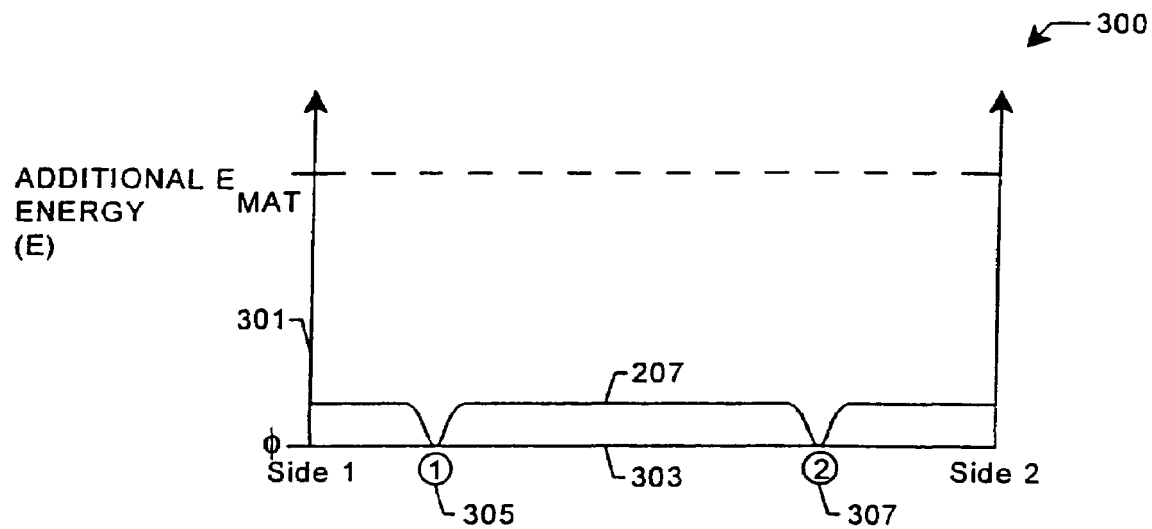

Substrates, however, are not generally free from defects or "weak" regions across the possible cleave front or selected depth $z_o$ after the implantation process. In these cases, the cleave generally cannot be controlled, since they are subject to random variations such as bulk material non-uniformities, built-in stresses, defects, and the like. FIG. 3 is a simplified energy diagram 300 across a cleave front for the implanted substrate 10 having these defects. The diagram 300 is merely an illustration and should not limit the scope of the claims herein. The diagram has a vertical axis 301 which represents additional energy (E) and a horizontal axis 303 which represents a distance from side 1 to side 2 of the substrate, that is, the horizontal axis represents regions along the cleave front of the substrate. As shown, the cleave front has two regions 305 and 307 represented as region 1 and region 2, respectively, which have cleave energies less than the average cleave energy ($E_{cz}$) 207 (possibly due to a higher concentration of defects or the like). Accordingly, it is highly likely that the cleave process begins at one or both of the above regions, since each region has a lower cleave energy than surrounding regions.

Figure 4:
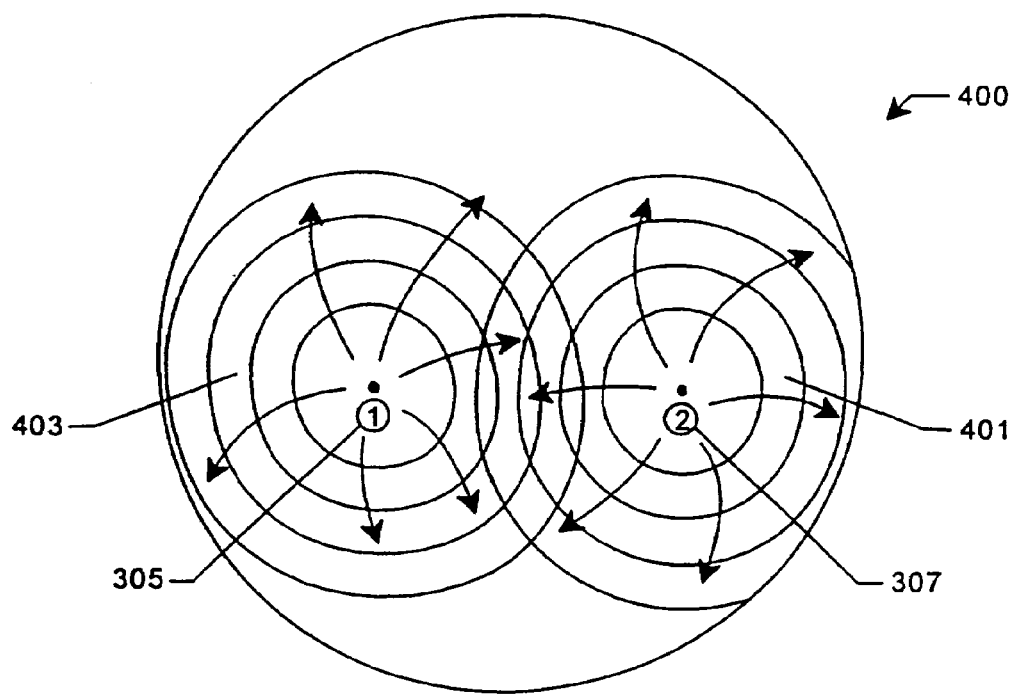

An example of a cleave process for the substrate illustrated by the above Fig. is described as follows with reference to FIG. 4. FIG. 4 is a simplified top-view diagram 400 of multiple cleave fronts 401, 403 propagating through the implanted substrate. The cleave fronts originate at "weaker" regions in the cleave plane, which specifically includes regions 1 and 2. The cleave fronts originate and propagate randomly as shown by the arrows. A limitation with the use of random propagation among multiple cleave fronts is the possibility of having different cleave fronts join along slightly different planes or the possibility of forming cracks, which is described in more detail below.

Figure 5:
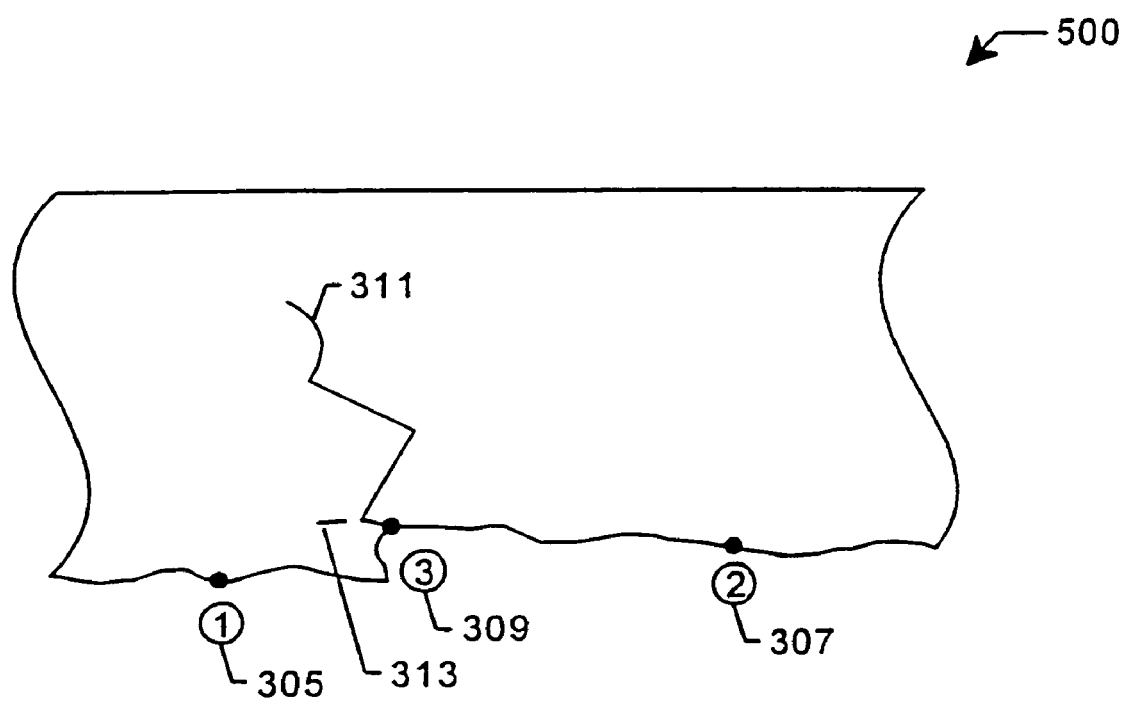

FIG. 5 is a simplified cross-sectional view 500 of a film cleaved from a wafer having multiple cleave fronts at, for example, regions 1 305 and 2 307. This diagram is merely an illustration and should not limit the scope of the claims herein. As shown, the cleave from region 1 joined with the cleave from region 2 at region 3 309, which is defined along slightly different planes, may initiate a secondary cleave or crack 311 along the film. Depending upon the magnitude of the difference 313, the film may not be of sufficient quality for use in manufacture of substrates for integrated circuits or other applications. A substrate having crack 311 generally cannot be used for processing. Accordingly, it is generally undesirable to cleave a wafer using multiple fronts in a random manner. An example of a technique which may form multiple cleave fronts in a random manner is described in U.S. Pat. No. 5,374,564, which is in the name of Michel Bruel ("Bruel"), and assigned to Commissariat A l'Energie Atomique in France. Bruel generally describes a technique for cleaving an implanted wafer by global thermal treatment (i.e., thermally treating the entire plane of the implant) using thermally activated diffusion. Global thermal treatment of the substrate generally causes an initiation of multiple cleave fronts which propagate independently. In general, Bruel discloses a technique for an "uncontrollable" cleaving action by way of initiating and maintaining a cleaving action by a global thermal source, which may produce undesirable results. These undesirable results include potential problems such as an imperfect joining of cleave fronts, an excessively rough surface finish on the surface of the cleaved material since the energy level for maintaining the cleave exceeds the amount required, and many others. The present invention overcomes the formation of random cleave fronts by a controlled distribution or selective positioning of energy on the implanted substrate.

Figure 6:
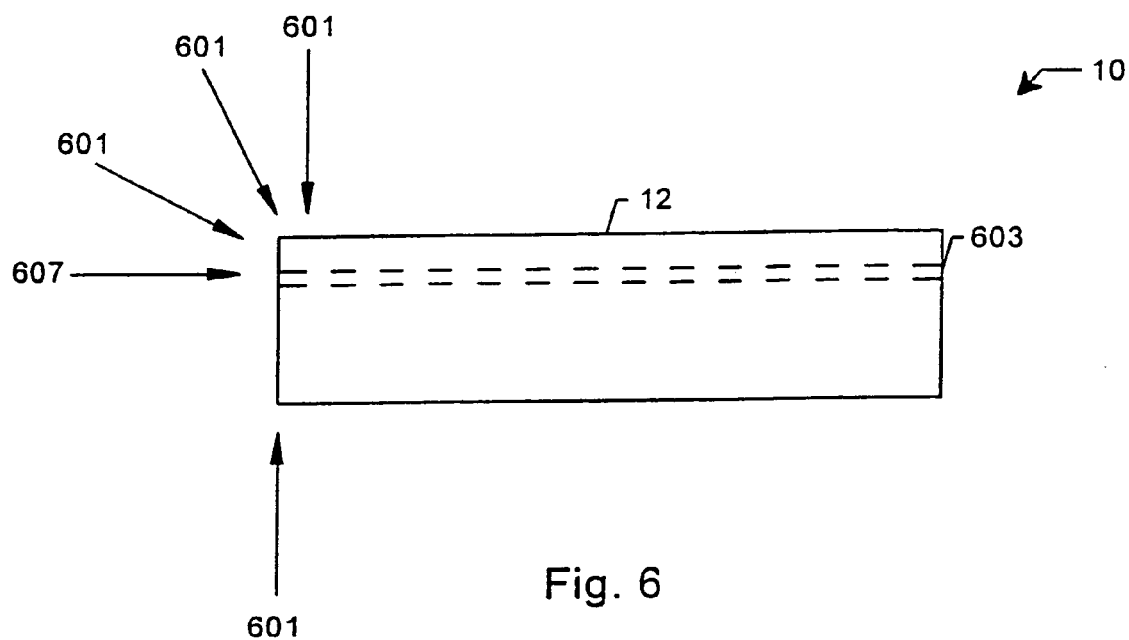

FIG. 6 is a simplified cross-sectional view of an implanted substrate 10 using selective positioning of cleave energy according to the present invention. This diagram is merely an illustration, and should not limit the scope of the claims herein. The implanted wafer undergoes a step of selective energy placement or positioning or targeting which provides a controlled cleaving action of the material region 12 at the selected depth. The impulse or impulses are provided using energy sources. Examples of sources include, among others, a chemical source, a mechanical source, an electrical source, and a thermal sink or source. The chemical source can include particles, fluids, gases, or liquids. These sources can also include a chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electromagnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, an electron beam, a thermoelectric heating, a furnace, and the like. The thermal sink can be selected from a fluid jet, a liquid jet, a gas jet, a cryogenic fluid, a super-cooled liquid, a thermoelectric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used depends upon the application.

Figure 7:
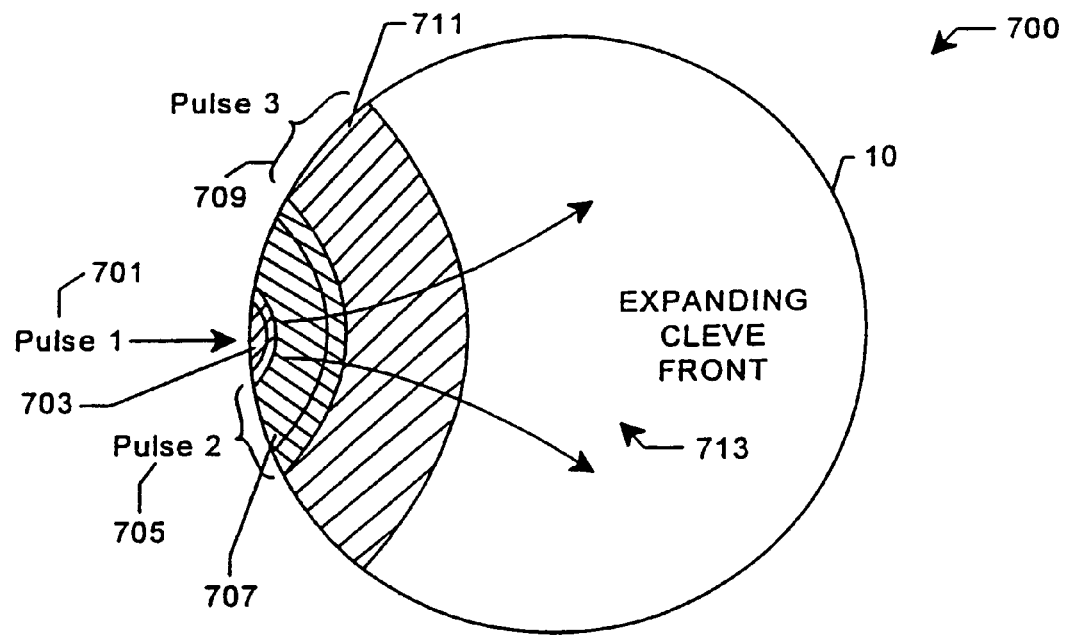

In a specific embodiment, the present invention provides a controlled-propagating cleave. The controlled-propagating cleave uses multiple successive impulses to initiate and perhaps propagate a cleaving process 700, as illustrated by FIG. 7. This diagram is merely an illustration, and should not limit the scope of the claims herein. As shown, the impulse is directed at an edge of the substrate, which propagates a cleave front toward the center of the substrate to remove the material layer from the substrate. In this embodiment, a source applies multiple pulses (i.e., pulse 1, 2, and 3) successively to the substrate. Pulse 1 701 is directed to an edge 703 of the substrate to initiate the cleave action. Pulse 2 705 is also directed at the edge 707 on one side of pulse 1 to expand the cleave front. Pulse 3 709 is directed to an opposite edge 711 of pulse 1 along the expanding cleave front to further remove the material layer from the substrate. The combination of these impulses or pulses provides a controlled cleaving action 713 of the material layer from the substrate.

Figure 8:
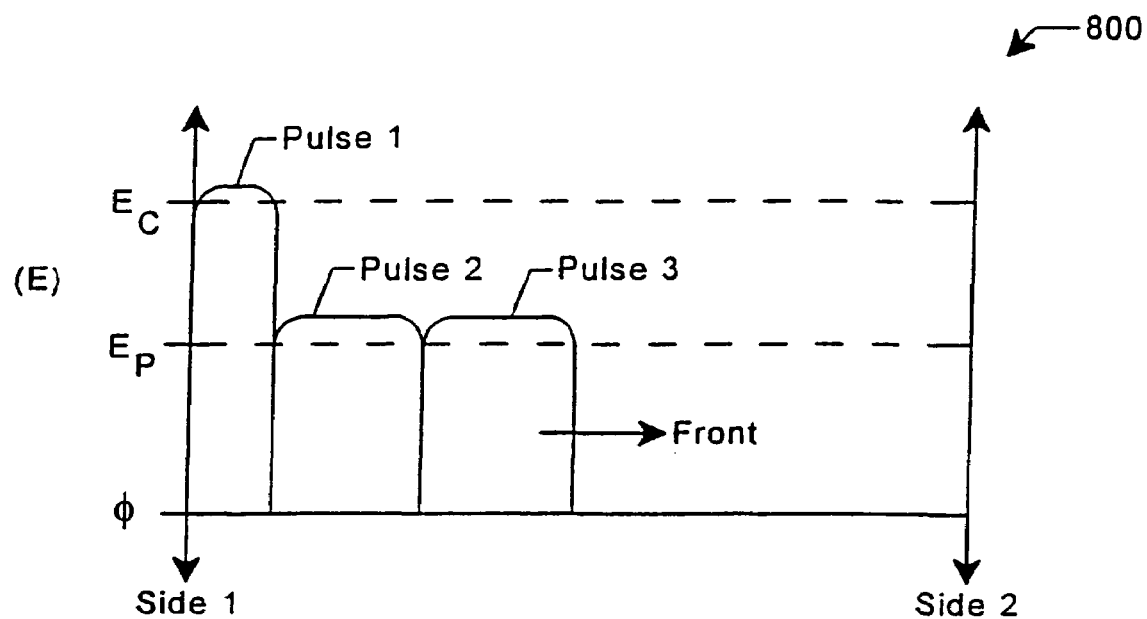

FIG. 8 is a simplified illustration of selected energies 800 from the pulses in the preceding embodiment for the controlled-propagating cleave. This diagram is merely an illustration, and should not limit the scope of the claims herein. As shown, the pulse 1 has an energy level which exceeds average cleaving energy (E), which is the necessary energy for initiating the cleaving action. Pulses 2 and 3 are made using lower energy levels along the cleave front to maintain or sustain the cleaving action. In a specific embodiment, the pulse is a laser pulse where an impinging beam heats a selected region of the substrate through a pulse and a thermal pulse gradient causes supplemental stresses which together exceed cleave formation or propagation energies, which create a single cleave front. In preferred embodiments, the impinging beam heats and causes a thermal pulse gradient simultaneously, which exceeds cleave energy formation or propagation energies. More preferably, the impinging beam cools and causes a thermal pulse gradient simultaneously, which exceeds cleave energy formation or propagation energies.

Optionally, a built-in energy state of the substrate or stress can be globally raised toward the energy level necessary to initiate the cleaving action, but not enough to initiate the cleaving action before directing the multiple successive impulses to the substrate according to the present invention. The global energy state of the substrate can be raised or lowered using a variety of sources such as chemical, mechanical, thermal (sink or source), or electrical, alone or in combination. The chemical source can include a variety such as particles, fluids, gases, or liquids. These sources can also include chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electromagnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, an electron beam, a thermoelectric heating, and a furnace. The thermal sink can be selected from a fluid jet, a liquid jet, a gas jet, a cryogenic fluid, a super-cooled liquid, a thermoelectric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used also depends upon the application. As noted, the global source increases a level of energy or stress in the material region without initiating a cleaving action in the material region before providing energy to initiate the controlled cleaving action.

In a specific embodiment, an energy source elevates an energy level of the substrate cleave plane above its cleave front propagation energy but is insufficient to cause self-initiation of a cleave front. In particular, a thermal energy source or sink in the form of heat or lack of heat (e.g., cooling source) can be applied globally to the substrate to increase the energy state or stress level of the substrate without initiating a cleave front. Alternatively, the energy source can be electrical, chemical, or mechanical. A directed energy source provides an application of energy to a selected region of the substrate material to initiate a cleave front which self-propagates through the implanted region of the substrate until the thin film of material is removed. A variety of techniques can be used to initiate the cleave action. These techniques are described by way of the Figs. below.

Figure 9:
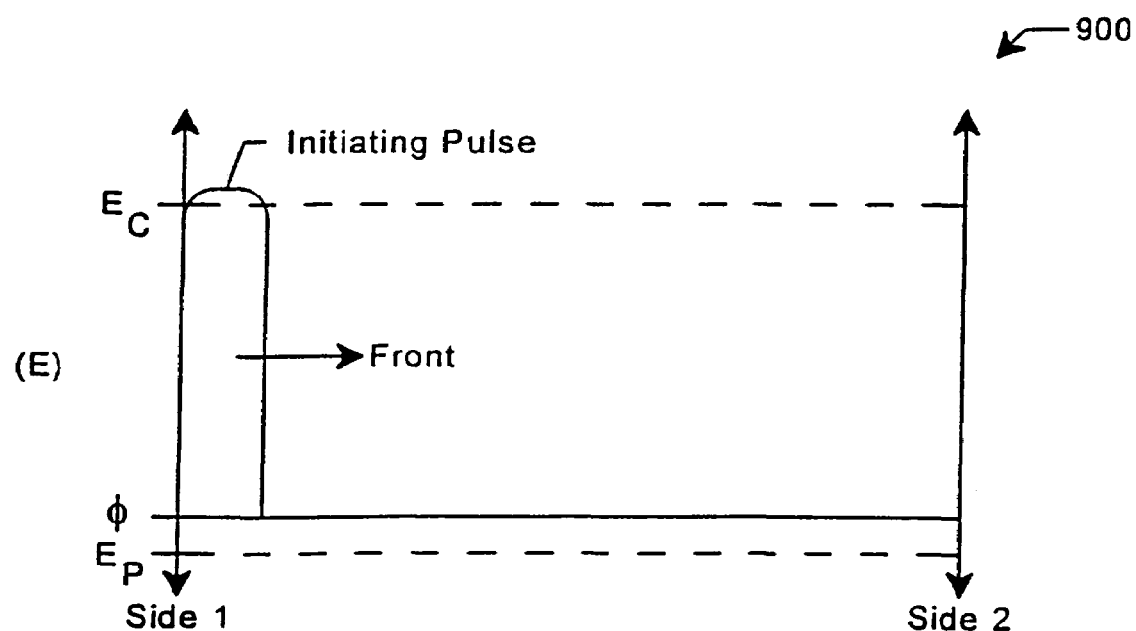

FIG. 9 is a simplified illustration of an energy state 900 for a controlled cleaving action using a single controlled source according to an aspect of the present invention. This diagram is merely an illustration, and should not limit the scope of the claims herein. In this embodiment, the energy level or state of the substrate is raised using a global energy source above the cleave front propagation energy state, but is lower than the energy state necessary to initiate the cleave front. To initiate the cleave front, an energy source such as a laser directs a beam in the form of a pulse at an edge of the substrate to initiate the cleaving action. Alternatively, the energy source can be a cooling fluid (e.g., liquid, gas) that directs a cooling medium in the form of a pulse at an edge of the substrate to initiate the cleaving action. The global energy source maintains the cleaving action which generally requires a lower energy level than the initiation energy.

Figure 10:
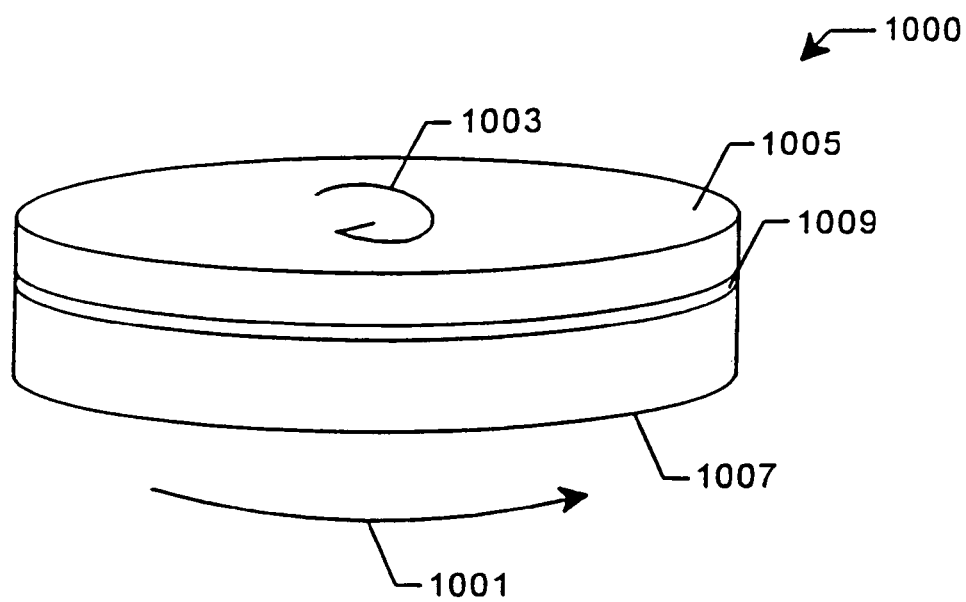
Figure 11:
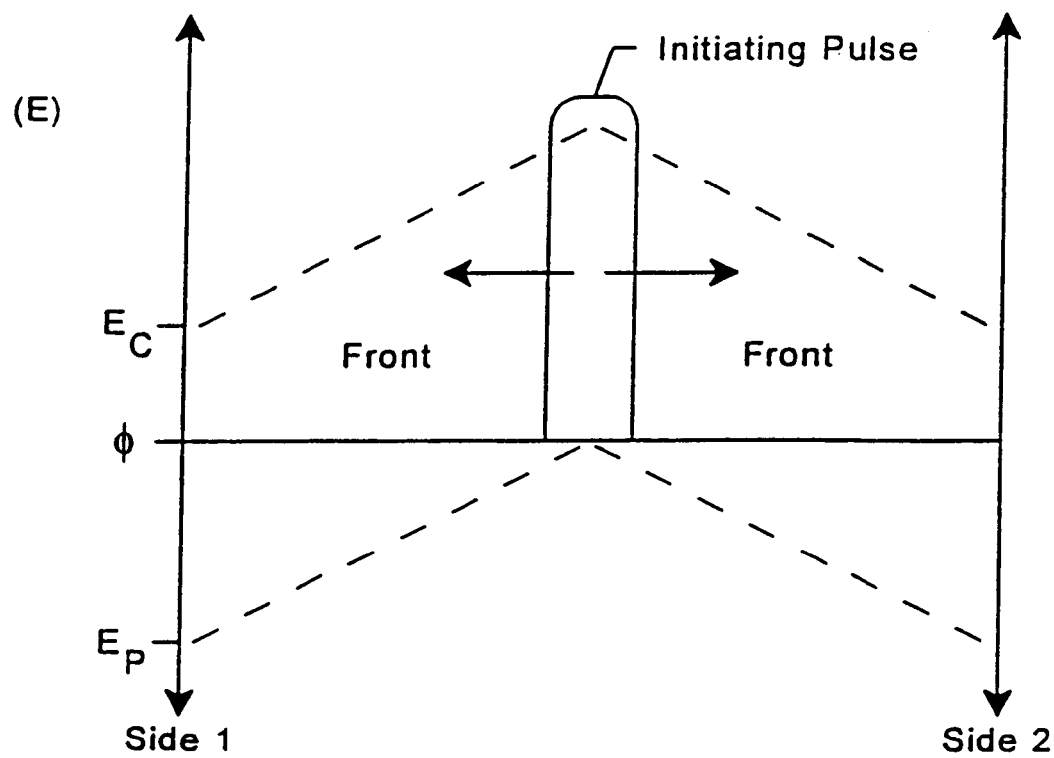

An alternative aspect of the invention is illustrated by FIGS. 10 and 11. FIG. 10 is a simplified illustration of an implanted substrate 1000 undergoing rotational forces 1001, 1003. This diagram is merely an illustration, and should not limit the scope of the claims herein. As shown, the substrate includes a top surface 1005, a bottom surface 1007, and an implanted region 1009 at a selected depth. An energy source increases a global energy level of the substrate using a light beam or heat source to a level above the cleave front propagation energy state, but lower than the energy state necessary to initiate the cleave front. The substrate undergoes a rotational force turning clockwise 1001 on top surface and a rotational force turning counter-clockwise 1003 on the bottom surface which creates stress at the implanted region 1009 to initiate a cleave front. Alternatively, the top surface undergoes a counter-clockwise rotational force and the bottom surface undergoes a clockwise rotational force. Of course, the direction of the force generally does not matter in this embodiment.

FIG. 11 is a simplified diagram of an energy state 1100 for the controlled cleaving action using the rotational force according to the present invention. This diagram is merely an illustration, and should not limit the scope of the claims herein. As previously noted, the energy level or state of the substrate is raised using a global energy source (e.g., thermal, beam) above the cleave front propagation energy state, but is lower than the energy state necessary to initiate the cleave front. To initiate the cleave front, a mechanical energy means such as rotational force applied to the implanted region initiates the cleave front. In particular, rotational force applied to the implanted region of the substrates creates zero stress at the center of the substrate and greatest at the periphery, essentially being proportional to the radius. In this example, the central initiating pulse causes a radially expanding cleave front to cleave the substrate.

The removed material region provides a thin film of silicon material for processing. The silicon material possesses limited surface roughness and desired planarity characteristics for use in a silicon-on-insulator substrate. In certain embodiments, the surface roughness of the detached film has features that are less than about 60 nm, or less than about 40 nm, or less than about 20 nm. Accordingly, the present invention provides thin silicon films which can be smoother and more uniform than pre-existing techniques.

Figure 12A:
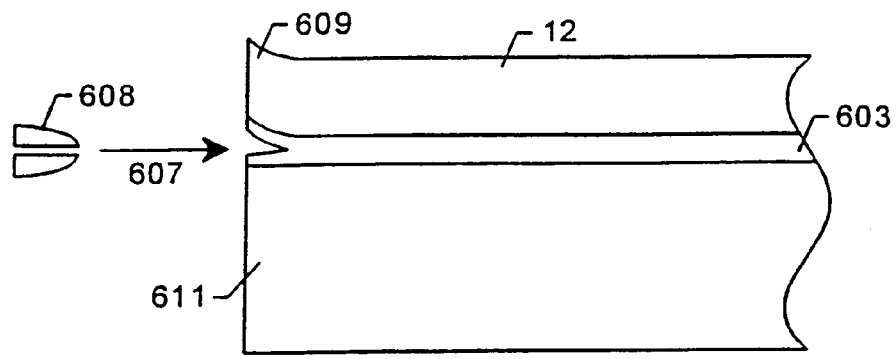
FIG. 12A is a simplified diagram illustrating a controlled cleaving technique using dynamic pressure embodied as a high-pressure jet of fluid or gas to separate a thin film of material from a donor wafer according to another embodiment of the present invention.

In a specific embodiment, the energy source can be a fluid jet that is pressurized (e.g., compressional) according to an embodiment of the present invention. FIG. 12A shows a simplified cross-sectional view diagram of a fluid jet from a fluid nozzle 608 used to perform the controlled cleaving process according to an embodiment of the present invention. The fluid jet 607 (or liquid jet or gas jet) impinges on an edge region of substrate 10 to initiate the controlled cleaving process. The fluid jet from a compressed or pressurized fluid source is directed to a region at the selected depth 603 to cleave a thickness of material region 12 from substrate 10 using force, e.g., mechanical, chemical, thermal. As shown, the fluid jet separates substrate 10 into two regions, including region 609 and region 611 that separate from each other at selected depth 603. The fluid jet can also be adjusted to initiate and maintain the controlled cleaving process to separate material 12 from substrate 10. Depending upon the application, the fluid jet can be adjusted in direction, location, and magnitude to achieve the desired controlled cleaving process. The fluid jet can be a liquid jet or a gas jet or a combination of liquid and gas. The fluid jet can separate a thin film from the substrate at ambient (i.e. room) temperature, but the substrate and/or jet can also be heated or cooled to facilitate the separation process.

Figure 12B:
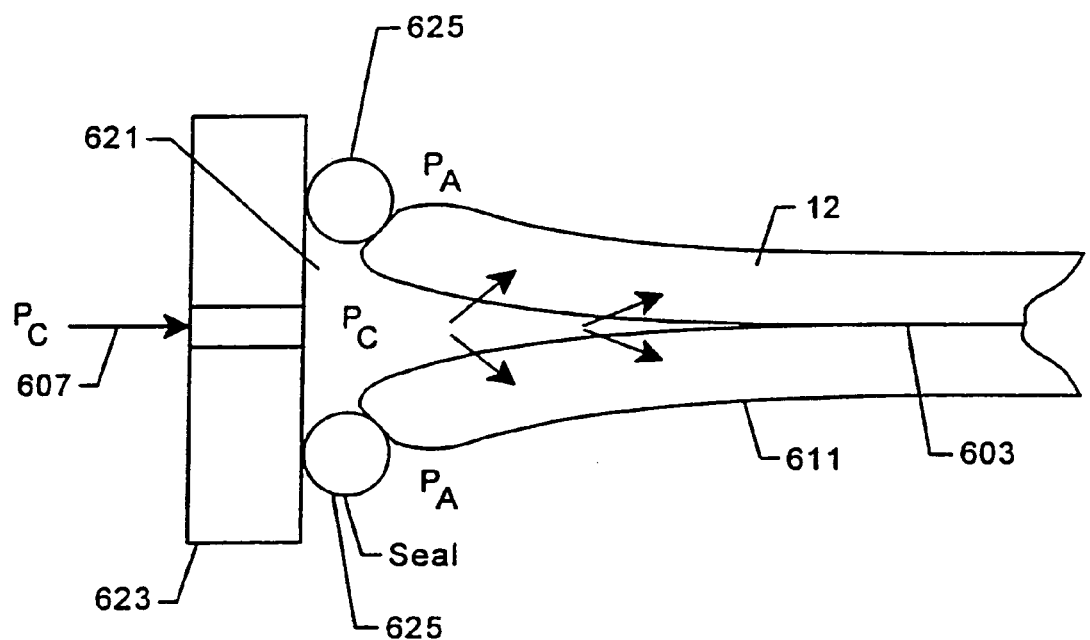
FIG. 12B is a simplified diagram illustrating a controlled cleaving technique using static pressue to separate a thin film of material from a donor wafer according to another embodiment of the present invention.
Figure 13:
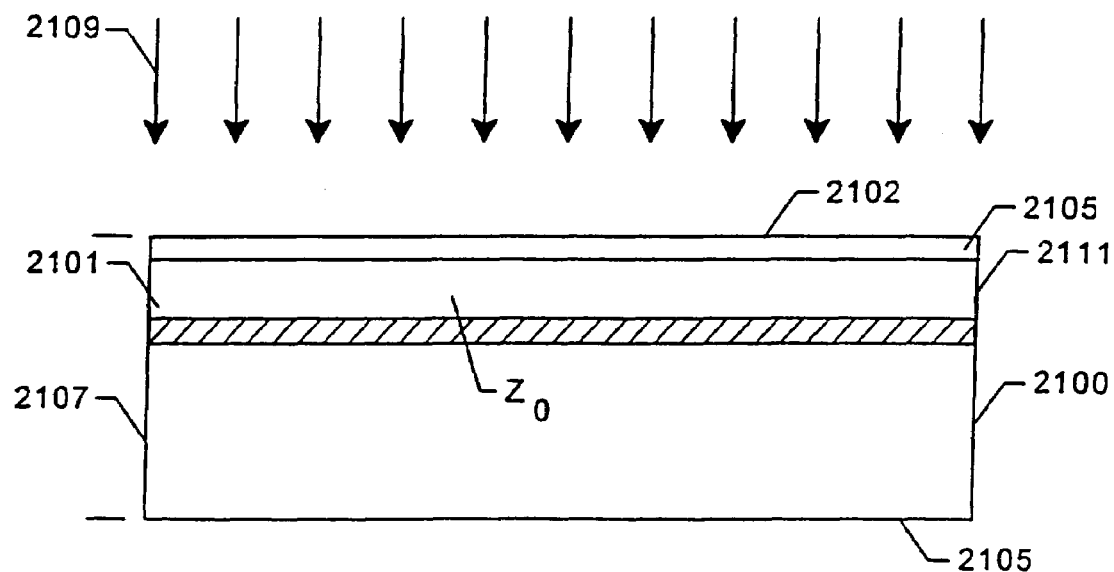
FIG. 13 is a simplified diagram illustrating the use of static fluid pressure to separate a thin film of material from a donor wafer.

In a preferred embodiment, the energy source can be a compressional source such as, for example, compressed fluid that is static. FIG. 12B shows a simplified cross-sectional view diagram of a compressed fluid source 607 according to an embodiment of the present invention. The compressed fluid source 607 (e.g., pressurized liquid, pressurized gas) is applied to a sealed chamber 621, which surrounds a periphery or edge of the substrate 10. As shown, the chamber is enclosed by device 623, which is sealed by, for example, O-rings 625 or the like, and which surrounds the outer edge of the substrate. The chamber has a pressure maintained at PC that is applied to the edge region of substrate 10 to initiate the controlled cleaving process at the selected depth of implanted material. The outer surface or face of the substrate is maintained at pressure PA which can be ambient pressure e.g., 1 atmosphere or less. A pressure differential exists between the pressure in the chamber, which is higher, and the ambient pressure. The pressure difference applies force to the implanted region at the selected depth 603. The implanted region at the selected depth is structurally weaker than surrounding regions, including any bonded regions. Force is applied via the pressure differential until the controlled cleaving process is initiated. The controlled cleaving process separates the thickness of material 609 from substrate material 611 to split the thickness of material from the substrate material at the selected depth. Additionally, pressure PC forces material region 12 to separate by a "prying action" from substrate material 611. During the cleaving process, the pressure in the chamber can also be adjusted to initiate and maintain the controlled cleaving process to separate material 12 from substrate 10. Depending upon the application, the pressure can be adjusted in magnitude to achieve the desired controlled cleaving process. The fluid pressure can be derived from a liquid or a gas or a combination of liquid and gas. Optionally, a mechanical force, as from a pin or blade, may be applied to the edge of the implanted region to initiate the cleaving process, which typically reduces the maximum pressure differential required between the chamber and the ambient.

In a preferred embodiment, the present invention is practiced at temperatures that are lower than those used by pre-existing techniques. In particular, the present invention does not require increasing the entire substrate temperature to initiate and sustain the cleaving action as preexisting techniques. In some embodiments for silicon wafers and hydrogen implants, substrate temperature does not exceed about 400° C. during the cleaving process. Alternatively, substrate temperature does not exceed about 350° C. during the cleaving process. Alternatively, substrate temperature is kept substantially below implanting temperatures via a thermal sink, e.g., cooling fluid, cryogenic fluid. Accordingly, the present invention reduces a possibility of unnecessary damage from an excessive release of energy from random cleave fronts, which generally improves surface quality of a detached film(s) and/or the substrate(s). Accordingly, the present invention provides resulting films on substrates at higher overall yields and quality.

The above embodiments are described in terms of cleaving a thin film of material from a substrate. The substrate, however, can be disposed on a workpiece such as a stiffener or the like before the controlled cleaving process. The workpiece joins to a top surface or implanted surface of the substrate to provide structural support to the thin film of material during controlled cleaving processes. The workpiece can be joined to the substrate using a variety of bonding or joining techniques, e.g., electro-statics, adhesives, interatomic. Some of these bonding techniques are described herein. The workpiece can be made of a dielectric material (e.g., quartz, glass, sapphire, silicon nitride, silicon dioxide), a conductive material (silicon, silicon carbide, polysilicon, group III/V materials, metal), and plastics (e.g., polyimide-based materials). Of course, the type of workpiece used will depend upon the application.

Alternatively, the substrate having the film to be detached can be temporarily disposed on a transfer substrate such as a stiffener or the like before the controlled cleaving process. The transfer substrate joins to a top surface or implanted surface of the substrate having the film to provide structural support to the thin film of material during controlled cleaving processes. The transfer substrate can be temporarily joined to the substrate having the film using a variety of bonding or joining techniques, e.g., electrostatics, adhesives, interatomic. Some of these bonding techniques are described herein. The transfer substrate can be made of a dielectric material (e.g., quartz, glass, sapphire, silicon nitride, silicon dioxide), a conductive material (silicon, silicon carbide, polysilicon, group III/V materials, metal), and plastics (e.g., polyimide-based materials). Of course, the type of transfer substrate used will depend upon the application. Additionally, the transfer substrate can be used to remove the thin film of material from the cleaved substrate after the controlled cleaving process.

2. Silicon-On-Insulator Process

A process for fabricating a silicon-on-insulator substrate according to the present invention may be briefly outlined as follows:

(1) Provide a donor silicon wafer (which may be coated with a dielectric material);
(2) Introduce particles into the silicon wafer to a selected depth to define a thickness of silicon film;
(3) Provide a target substrate material (which may be coated with a dielectric material);
(4) Bond the donor silicon wafer to the target substrate material by joining the implanted face to the target substrate material;
(5) Increase global stress (or energy) of implanted region at selected depth without initiating a cleaving action (optional);
(6) Provide stress (or energy) to a selected region of the bonded substrates to initiate a controlled cleaving action at the selected depth;
(7) Provide additional energy to the bonded substrates to sustain the controlled cleaving action to free the thickness of silicon film from the silicon wafer (optional);
(8) Complete bonding of donor silicon wafer to the target substrate; and
(9) Polish a surface of the thickness of silicon film.

The above sequence of steps provides a step of initiating a controlled cleaving action using an energy applied to a selected region(s) of a multi-layered substrate structure to form a cleave front(s) according to the present invention. This initiation step begins a cleaving process in a controlled manner by limiting the amount of energy applied to the substrate. Further propagation of the cleaving action can occur by providing additional energy to selected regions of the substrate to sustain the cleaving action, or using the energy from the initiation step to provide for further propagation of the cleaving action. This sequence of steps is merely an example and should not limit the scope of the claims defined herein. Further details with regard to the above sequence of steps are described in below in references to the Figs.

Figure 14:
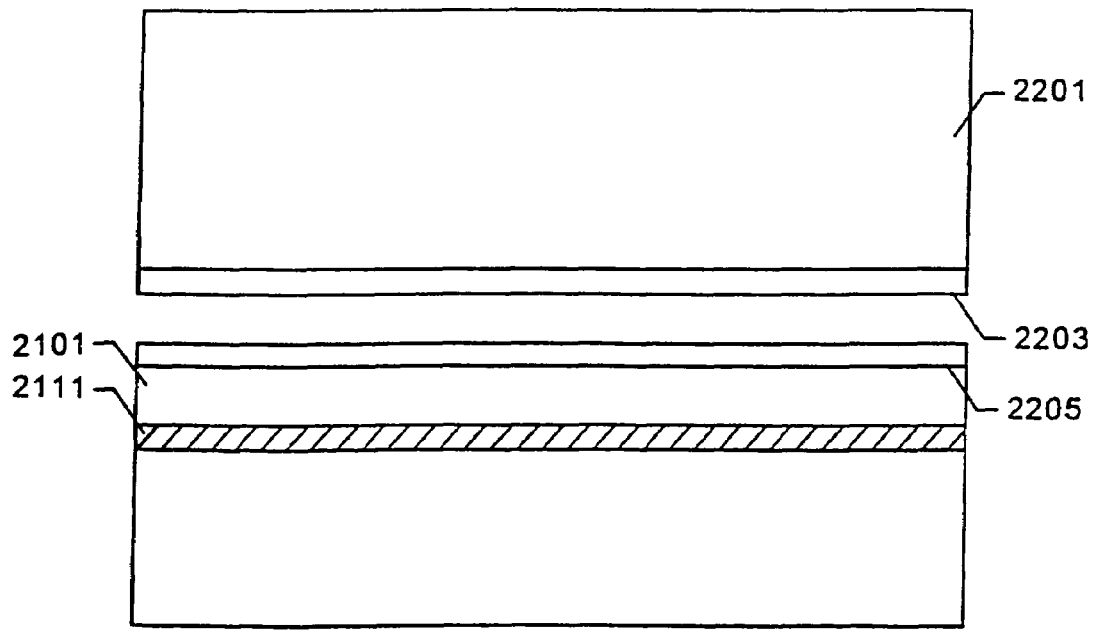
FIGS. 14-18 are simplified cross-sectional view diagrams illustrating a method of forming a silicon-on-insulator substrate according to the present invention.

FIGS. 14-19 are simplified cross-sectional view diagrams of substrates undergoing a fabrication process for a silicon-on-insulator wafer according to the present invention. The process begins by providing a semiconductor substrate similar to the silicon wafer 2100, as shown by FIG. 14. Substrate or donor includes a material region 2101 to be removed, which is a thin relatively uniform film derived from the substrate material. The silicon wafer includes a top surface 2103, a bottom surface 2105, and a thickness 2107. Material region also includes a thickness ($z_0$), within the thickness 2107 of the silicon wafer. Optionally, a dielectric layer 2102 (e.g., silicon nitride, silicon oxide, silicon oxynitride) overlies the top surface of the substrate. The present process provides a novel technique for removing the material region 2101 using the following sequence of steps for the fabrication of a silicon-on-insulator wafer.

Selected energetic particles 2109 implant through the top surface of the silicon wafer to a selected depth, which defines the thickness of the material region, termed the thin film of material. As shown, the particles have a desired concentration 2111 at the selected depth ($z_0$). A variety of techniques can be used to implant the energetic particles into the silicon wafer. These techniques include ion implantation using, for example, beam line ion implantation equipment manufactured from companies such as Applied Materials, Eaton Corporation, Varian, and others. Alternatively, implantation occurs using a plasma immersion ion implantation ("PIII") technique. Of course, techniques used depend upon the application.

Depending upon the application, smaller mass particles are generally selected to reduce a possibility of damage to the material region. That is, smaller mass particles easily travel through the substrate material to the selected depth without substantially damaging the material region that the particles traversed through. For example, the smaller mass particles (or energetic particles) can be almost any charged (e.g., positive or negative) and/or neutral atoms or molecules, or electrons, or the like. In a specific embodiment, the particles can be neutral and/or charged particles including ions of hydrogen and its isotopes, rare gas ions such as helium and its isotopes, and neon. The particles can also be derived from compounds such as gases, e.g., hydrogen gas, water vapor, methane, and other hydrogen compounds, and other light atomic mass particles. Alternatively, the particles can be any combination of the above particles, and/or ions and/or molecular species and/or atomic species.

Figure 15:
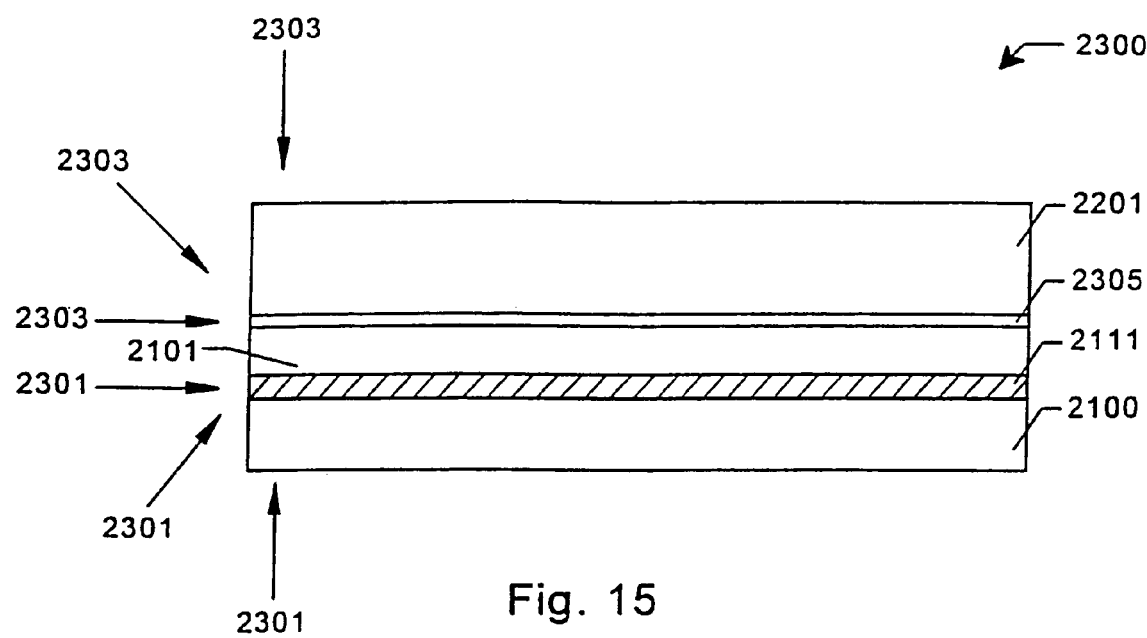

The process uses a step of joining the implanted silicon wafer to a workpiece 2200 or target wafer, as illustrated in FIG. 15. The workpiece may also be a variety of other types of substrates such as those made of a dielectric material (e.g., quartz, glass, silicon nitride, silicon dioxide), a conductive material (silicon, polysilicon, group III/V materials, metal), and plastics (e.g., polyimide-based materials). In the present example, however, the workpiece is a silicon wafer.

In a specific embodiment, the silicon wafers are joined or fused together using a low temperature thermal step. The low temperature thermal process generally ensures that the implanted particles do not place excessive stress on the material region, which can produce an uncontrolled cleave action. In one aspect, the low temperature bonding process occurs by a self-bonding process. In particular, one wafer is stripped to remove oxidation therefrom (or one wafer is not oxidized). A cleaning solution treats the surface of the wafer to form O—H bonds on the wafer surface. An example of a solution used to clean the wafer is a mixture of $H_2O_2$—$H_2SO_4$. A dryer dries the wafer surfaces to remove any residual liquids or particles from the wafer surfaces. Self-bonding occurs by placing a face of the cleaned wafer against the face of an oxidized wafer.

Alternatively, a self-bonding process occurs by activating one of the wafer surfaces to be bonded by plasma cleaning. In particular, plasma cleaning activates the wafer surface using a plasma derived from gases such as argon, ammonia, neon, water vapor, and oxygen. The activated wafer surface 2203 is placed against a face of the other wafer, which has a coat of oxidation 2205 thereon. The wafers are in a sandwiched structure having exposed wafer faces. A selected amount of pressure is placed on each exposed face of the wafers to self-bond one wafer to the other.

Alternatively, an adhesive disposed on the wafer surfaces is used to bond one wafer onto the other. The adhesive includes an epoxy, polyimide-type materials, and the like. Spin-on-glass layers can be used to bond one wafer surface onto the face of another. These spin-on-glass ("SOG") materials include, among others, siloxanes or silicates, which are often mixed with alcohol-based solvents or the like. SOG can be a desirable material because of the low temperatures (e.g., 150 to 250° C.) often needed to cure the SOG after it is applied to surfaces of the wafers.

Alternatively, a variety of other low temperature techniques can be used to join the donor wafer to the target wafer. For instance, an electro-static bonding technique can be used to join the two wafers together. In particular, one or both wafer surface(s) is charged to attract to the other wafer surface. Additionally, the donor wafer can be fused to the target wafer using a variety of commonly known techniques. Of course, the technique used depends upon the application.

Figure 16:
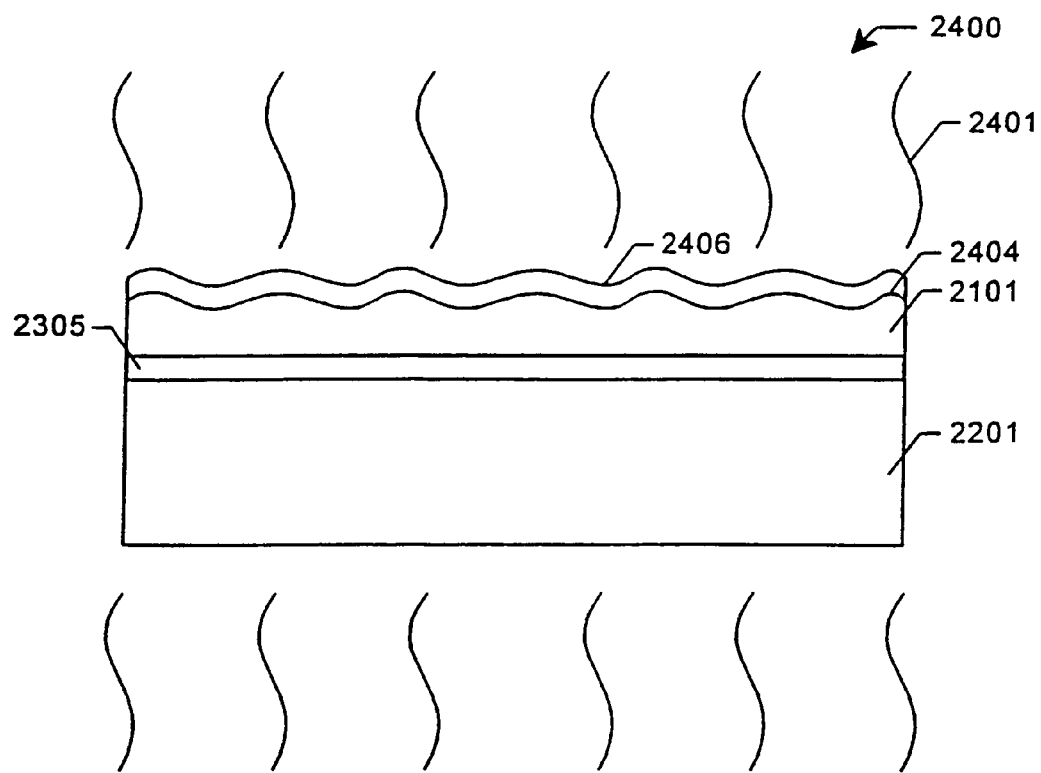

After bonding the wafers into a sandwiched structure 2300, as shown in FIG. 16, the method includes a controlled cleaving action to remove the substrate material to provide a thin film of substrate material 2101 overlying an insulator 2305 the target silicon wafer 2201. The controlled-cleaving occurs by way of selective energy placement or positioning or targeting 2301, 2303 of energy sources onto the donor and/or target wafers. For instance, an energy impulse(s) can be used to initiate the cleaving action. The impulse (or impulses) is provided using an energy source which include, among others, a mechanical source, a chemical source, a thermal sink or source, and an electrical source.

The controlled cleaving action is initiated by way of any of the previously noted techniques and others and is illustrated by way of FIG. 16. For instance, a process for initiating the controlled cleaving action uses a step of providing energy 2301, 2303 to a selected region of the substrate to initiate a controlled cleaving action at the selected depth ($z_0$) in the substrate, whereupon the cleaving action is made using a propagating cleave front to free a portion of the substrate material to be removed from the substrate. In a specific embodiment, the method uses a single impulse to begin the cleaving action, as previously noted. Alternatively, the method uses an initiation impulse, which is followed by another impulse or successive impulses to selected regions of the substrate. Alternatively, the method provides an impulse to initiate a cleaving action which is sustained by a scanned energy along the substrate. Alternatively, energy can be scanned across selected regions of the substrate to initiate and/or sustain the controlled cleaving action.

Optionally, an energy or stress of the substrate material is increased toward an energy level necessary to initiate the cleaving action, but not enough to initiate the cleaving action before directing an impulse or multiple successive impulses to the substrate according to the present invention. The global energy state of the substrate can be raised or lowered using a variety of sources such as chemical, mechanical, thermal (sink or source), or electrical, alone or in combination. The chemical source can include particles, fluids, gases, or liquids. These sources can also include chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electromagnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, an electron beam, a thermoelectric heating, and a furnace. The thermal sink can be selected from a fluid jet, a liquid jet, a gas jet, a cryogenic fluid, a super-cooled liquid, a thermoelectric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used depends upon the application. As noted, the global source increases a level of energy or stress in the material region without initiating a cleaving action in the material region before providing energy to initiate the controlled cleaving action.

In a preferred embodiment, the method maintains a temperature which is below a temperature of introducing the particles into the substrate. In some embodiments, the substrate temperature is maintained between −200 and 450° C. during the step of introducing energy to initiate propagation of the cleaving action. Substrate temperature can also be maintained at a temperature below 400° C. or below 350° C. In preferred embodiments, the method uses a thermal sink to initiate and maintain the cleaving action, which occurs at conditions significantly below room temperature.

Figure 17:
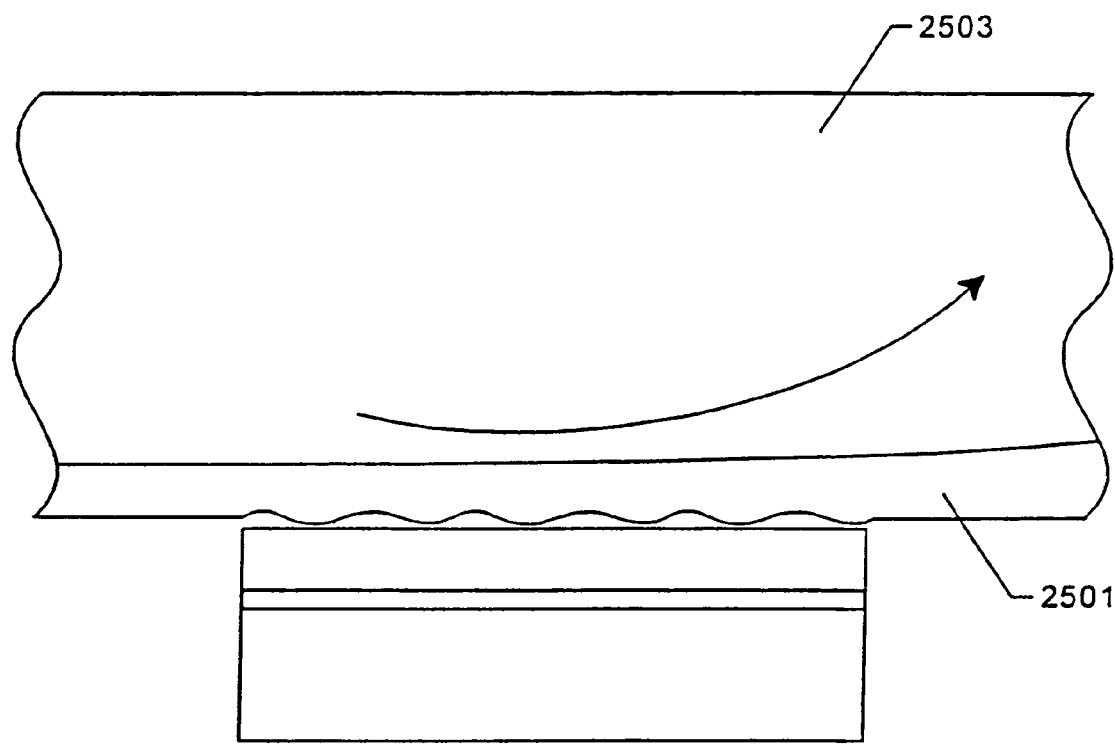

A final bonding step occurs between the target wafer and thin film of material region according to some embodiments, as illustrated by FIG. 17. In one embodiment, one silicon wafer has an overlying layer of silicon dioxide, which is thermally grown overlying the face before cleaning the thin film of material, as shown in FIG. 15. The silicon dioxide can also be formed using a variety of other techniques, e.g., chemical vapor deposition. The silicon dioxide between the wafer surfaces fuses together thermally in this process.

In some embodiments, the oxidized silicon surface from either the target wafer or the thin film of material region (from the donor wafer) are further pressed together and are subjected to an oxidizing ambient 2401. The oxidizing ambient can be in a diffusion furnace for steam oxidation, hydrogen oxidation, or the like. A combination of the pressure and the oxidizing ambient fuses the thin film of silicon material 2101 to the target silicon wafer 2201 together at the oxide surface or interface 2305. These embodiments often require high temperatures (e.g., 700° C.).

Alternatively, the two silicon surfaces are further pressed together and subjected to an applied voltage between the two wafers. The applied voltage raises temperature of the wafers to induce a bonding between the wafers. This technique limits the amount of crystal defects introduced into the silicon wafers during the bonding process, since substantially no significant mechanical force is needed to initiate the bonding action between the wafers. Of course, the technique used depends upon the application.

After bonding the wafers, silicon-on-insulator has a target substrate with an overlying film of silicon material and a sandwiched oxide layer between the target substrate and the silicon film, as also illustrated in FIG. 15. The detached surface of the film of silicon material is often rough 2404 and needs finishing. Finishing occurs using a combination of grinding and/or polishing techniques. In some embodiments, the detached surface undergoes a step of grinding using, for examples, techniques such as rotating an abrasive material overlying the detached surface to remove any imperfections or surface roughness therefrom. A machine such as a "back grinder" made by a company called Disco may provide this technique.

Figure 18:
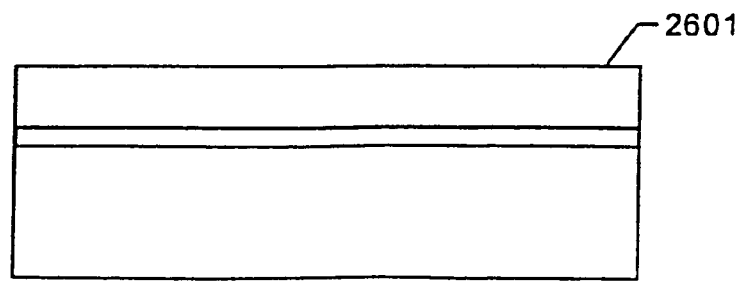

Alternatively, chemical mechanical polishing or planarization ("CMP") techniques finish the detached surface of the film, as illustrated by FIG. 18. In CMP, a slurry mixture is applied directly to a polishing surface 2501 which is attached to a rotating platen 2503. This slurry mixture can be transferred to the polishing surface by way of an orifice, which is coupled to a slurry source. The slurry is often a solution containing an abrasive and an oxidizer, e.g., $H_2O_2$, $KIO_3$, ferric nitrate. The abrasive is often a borosilicate glass, titanium dioxide, titanium nitride, aluminum oxide, aluminum trioxide, iron nitrate, cerium oxide, silicon dioxide (colloidal silica), silicon nitride, silicon carbide, graphite, diamond, and any mixtures thereof. This abrasive is mixed in a solution of deionized water and oxidizer or the like. Preferably, the solution is acidic.

This acid solution generally interacts with the silicon material from the wafer during the polishing process. The polishing process preferably uses a poly-urethane polishing pad. An example of this polishing pad is one made by Rodel and sold under the trade name of IC-1000. The polishing pad is rotated at a selected speed. A carrier head which picks up the target wafer having the film applies a selected amount of pressure on the backside of the target wafer such that a selected force is applied to the film. The polishing process removes about a selected amount of film material, which provides a relatively smooth film surface 2601 for subsequent processing, as illustrated by FIG. 18.

In certain embodiments, a thin film of oxide 2406 overlies the film of material overlying the target wafer, as illustrated in FIG. 17. The oxide layer forms during the thermal annealing step, which is described above for permanently bonding the film of material to the target wafer. In these embodiments, the finishing process is selectively adjusted to first remove oxide and the film is subsequently polished to complete the process. Of course, the sequence of steps depends upon the particular application.

Although the above description is in terms of a silicon wafer, other substrates may also be used. For example, the substrate can be almost any monocrystalline, polycrystalline, or even amorphous type substrate. Additionally, the substrate can be made of III/V materials such as gallium arsenide, gallium nitride (GaN), and others. The multi-layered substrate can also be used according to the present invention. The multi-layered substrate includes a silicon-on-insulator substrate, a variety of sandwiched layers on a semiconductor substrate, and numerous other types of substrates. Additionally, the embodiments above were generally in terms of providing a pulse of energy to initiate a controlled cleaving action. The pulse can be replaced by energy that is scanned across a selected region of the substrate to initiate the controlled cleaving action. Energy can also be scanned across selected regions of the substrate to sustain or maintain the controlled cleaving action. One of ordinary skill in the art would easily recognize a variety of alternatives, modifications, and variations, which can be used according to the present invention.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for forming multilayered substrates for flat panel displays, the method comprising:
   providing a donor substrate comprising an overlying a film of silicon material to be detached, the donor substrate having a cleave region formed within a vicinity of between the film of silicon material and a lower portion of the donor substrate;
   coupling a surface region of the film of silicon material from the donor substrate to a dielectric handle substrate;
   applying a voltage between the donor substrate including the film of silicon material and the dielectric handle substrate to induce bonding between the surface region of the film of silicon material and the dielectric handle substrate; and
   initiating a cleaving action to remove the film of silicon material using a propagating cleave front to form a multi-layered substrate, wherein the multi-layered substrate comprises the film of silicon material overlying the dielectric handle substrate, and wherein the voltage between the donor substrate and the handle substrate is provided by an electro-static bonding process.

2. The method of claim 1 wherein the voltage raises a temperature of the donor substrate and the dielectric handle substrate.

3. The method of claim 1 wherein the dielectric handle substrate comprises glass.

4. The method of claim 1 wherein the dielectric handle substrate comprises quartz.

5. The method of claim 1 wherein the multilayered substrate is the film of silicon material on the dielectric handle substrate comprising glass.

6. The method of claim 1 further comprising plasma activating the surface region of the film of silicon material before the coupling.

7. The method of claim 6 wherein the plasma activating comprises a plasma cleaning process.

8. The method of claim 7 wherein the plasma cleaning process uses a non-reactive gas.

9. The method of claim 1 wherein the surface region of the film of silicon material is dry before coupling.

10. The method of claim 1 wherein a surface region of the dielectric handle substrate is dry before coupling.

11. The method of claim 1 wherein the donor substrate and the dielectric handle substrate are subjected to a thermal source to elevate a temperature of the dielectric handle substrate and the donor substrate.

12. The method of claim 1 further comprising increasing a global energy of the donor substrate and the dielectric handle substrate using a thermal source.

13. A method for forming multilayered substrates for multi-layered substrates, the method comprising:
   providing a donor substrate comprising an overlying a film of silicon material to be detached, the donor substrate having a cleave region formed within a vicinity of between the film of silicon material and a lower portion of the donor substrate;

coupling a surface region of the film of silicon material from the donor substrate to a dielectric handle substrate;

applying a voltage between the donor substrate including the film of silicon material and the dielectric handle substrate to induce bonding between the surface region of the film of silicon material and the dielectric handle substrate;

increasing a temperature of the donor substrate and the dielectric handle substrate to increase a global energy of the donor substrate and the dielectric handle substrate; and initiating a cleaving action to remove the film of silicon material using a propagating cleave front to form a multi-layered substrate, wherein the multi-layered substrate comprises the film of silicon material overlying the dielectric handle substrate, and wherein the voltage between the donor substrate and the handle substrate is provided by an electro-static bonding process.

14. The method of claim 13 wherein the voltage causes the temperature of the donor substrate and the dielectric handle substrate to increase.

15. The method of claim 13 wherein the dielectric handle substrate comprises glass.

16. The method of claim 13 wherein the dielectric handle substrate comprises quartz.

17. The method of claim 13 wherein the multilayered substrate is the film of silicon material on the dielectric handle substrate comprising glass.

18. The method of claim 13 further comprising plasma activating the surface region of the film of silicon material before the coupling.

19. The method of claim 18 wherein the plasma activating comprises a plasma cleaning process.

20. The method of claim 19 wherein the plasma cleaning process uses a non-reactive gas.

21. The method of claim 13 wherein the surface region of the film of material is dry before coupling.

22. The method of claim 13 wherein a surface region of the dielectric handle substrate is dry before coupling.

23. The method of claim 13 wherein the increasing of the temperature is provided by a thermal source.

24. The method of claim 23 wherein the thermal source is selected from a photon beam, a fluid jet, a liquid jet, a gas jet, an electro/magnetic field, an electron beam, a thermo electric heating process, or a furnace.

25. The method of claim 23 wherein the thermal source is a time varying process.

26. The method of claim 13 wherein the cleaving action is in a selected portion of the donor substrate.

27. The method of claim 26 wherein the selected portion is an edge region.

28. A method for forming multilayered substrates for multi-layered substrates, the method comprising:

providing a donor substrate comprising an overlying a film of silicon material to be detached, the donor substrate having a cleave region formed within a vicinity of between the film of silicon material and a lower portion of the donor substrate;

coupling a surface region of the film of silicon material from the donor substrate to a dielectric handle substrate;

applying a voltage between the donor substrate including the film of silicon material and the dielectric handle substrate to induce bonding between the surface region of the film of silicon material and the dielectric handle substrate;

increasing a temperature of the donor substrate and the dielectric handle substrate to increase a global energy of the donor substrate and the dielectric handle substrate; and initiating a cleaving action to remove the film of silicon material using a propagating cleave front to form a multi-layered substrate, wherein the increasing of the temperature is provided by a thermal source, and wherein the thermal source is a spatially varying process.

29. The method of claim 28 wherein the spatially varying process is provided in a z-direction.

30. The method of claim 28 wherein the spatially varying process is provided along a face of the donor substrate.

31. The method of claim 28 wherein the thermal source is a continuous process.

32. A method for forming solar cells, the method comprising:

providing a donor substrate comprising an overlying a film of silicon material to be detached, the donor substrate having a cleave region formed within a vicinity of between the film of silicon material and a lower portion of the donor substrate;

coupling a surface region of the film of silicon material from the donor substrate to a dielectric handle substrate;

applying a voltage between the donor substrate including the film of silicon material and the dielectric handle substrate to induce bonding between the surface region of the film of silicon material and the dielectric handle substrate;

increasing a temperature of the donor substrate and the dielectric handle substrate to increase a global energy of the donor substrate and the dielectric handle substrate; and removing the film of silicon material for a solar cell.

33. A method for forming multilayered substrates for flat panel displays, the method comprising:

providing a donor substrate comprising an overlying a film of silicon material to be detached, the donor substrate having a cleave region formed within a vicinity of between the film of silicon material and a lower portion of the donor substrate;

coupling a surface region of the film of silicon material from the donor substrate to a dielectric handle substrate;

applying a voltage between the donor substrate including the film of silicon material and the dielectric handle substrate to induce bonding between the surface region of the film of silicon material and the dielectric handle substrate; and initiating a cleaving action to remove the film of silicon material using a propagating cleave front to form a multi-layered substrate, the method further comprising, introducing a plurality of particles through a surface of the donor substrate into the donor substrate, wherein the plurality of particles includes hydrogen in combination with helium.

34. The method of claim 33 wherein at least one of the plurality of particles is derived from a source selected from the group consisting of hydrogen gas, helium gas, water vapor, methane, and hydrogen compounds.

35. The method of claim 33 wherein at least one of the plurality of particles is selected from the group consisting of neutral molecules, neutral atoms, charged molecules, charged atoms, and electrons.

36. A method for forming multilayered substrates for flat panel displays, the method comprising:
providing a donor substrate comprising an overlying a film of silicon material to be detached, the donor substrate having a cleave region formed within a vicinity of between the film of silicon material and a lower portion of the donor substrate;
coupling a surface region of the film of silicon material from the donor substrate to a dielectric handle substrate;
applying a voltage between the donor substrate including the film of silicon material and the dielectric handle substrate to induce bonding between the surface region of the film of silicon material and the dielectric handle substrate; and
initiating a cleaving action to remove the film of silicon material using a propagating cleave front to form a multi-layered substrate, the method further comprising.
introducing a plurality of particles through a surface of the donor substrate into the donor substrate, wherein the plurality of particles includes hydrogen in combination with a rare gas.

37. A method for forming multilayered substrates for flat panel displays, the method comprising:
providing a donor substrate comprising an overlying a film of silicon material to be detached, the donor substrate having a cleave region formed within a vicinity of between the film of silicon material and a lower portion of the donor substrate;
coupling a surface region of the film of silicon material from the donor substrate to a dielectric handle substrate;
applying a voltage between the donor substrate including the film of silicon material and the dielectric handle substrate to induce bonding between the surface region of the film of silicon material and the dielectric handle substrate; and
initiating a cleaving action to remove the film of silicon material using a propagating cleave front to form a multi-layered substrate, the method further comprising,
introducing a plurality of particles through a surface of the donor substrate into the donor substrate, and
implanting a second plurality of particles through the surface into the donor substrate.

38. The method of claim 37 wherein the second plurality of particles includes hydrogen.

39. The method of claim 37 wherein one of the plurality of particles and the second plurality of particles includes hydrogen, and the other of the plurality of particles and the second plurality of particles includes helium.

40. The method of claim 37 wherein one of the plurality of particles and the second plurality of particles includes hydrogen, and the other of the plurality of particles and the second plurality of particles includes a rare gas.

41. The method of claim 37 wherein at least one of the plurality of particles is provided in the cleave region.

42. A method for forming multilayered substrates for flat panel displays, the method comprising:
providing a donor substrate comprising an overlying a film of silicon material to be detached, the donor substrate having a cleave region formed within a vicinity of between the film of silicon material and a lower portion of the donor substrate;
coupling a surface region of the film of silicon material from the donor substrate to a dielectric handle substrate;
applying a voltage between the donor substrate including the film of silicon material and the dielectric handle substrate to induce bonding between the surface region of the film of silicon material and the dielectric handle substrate; and
initiating a cleaving action to remove the film of silicon material using a propagating cleave front to form a multi-layered substrate, the method further comprising,
introducing a plurality of first particles through a surface of the donor substrate into the donor substrate, and
implanting a plurality of second particles through the surface into the donor substrate, wherein a first particle of the plurality of first particles or a second particle of the plurality of second particles is derived from a source selected from the group consisting of hydrogen gas, helium gas, water vapor, methane, and hydrogen compounds.

43. A method for forming multilayered substrates for flat panel displays, the method comprising:
providing a donor substrate comprising an overlying a film of silicon material to be detached, the donor substrate having a cleave region formed within a vicinity of between the film of silicon material and a lower portion of the donor substrate;
coupling a surface region of the film of silicon material from the donor substrate to a dielectric handle substrate;
applying a voltage between the donor substrate including the film of silicon material and the dielectric handle substrate to induce bonding between the surface region of the film of silicon material and the dielectric handle substrate; and
initiating a cleaving action to remove the film of silicon material using a propagating cleave front to form a multi-layered substrate, the method further comprising,
introducing a plurality of first particles through a surface of the donor substrate into the donor substrate, and
implanting a plurality of second particles through the surface into the donor substrate, wherein a first particle of the plurality of first particles or a second particle of the plurality of second particles is derived from a source selected from the group consisting of neutral molecules, neutral atoms, charged molecules, charged atoms, and electrons.

44. A method for forming multilayered substrates for flat panel displays, the method comprising:
providing a donor substrate comprising an overlying a film of silicon material to be detached, the donor substrate having a cleave region formed within a vicinity of between the film of silicon material and a lower portion of the donor substrate;
coupling a surface region of the film of silicon material from the donor substrate to a dielectric handle substrate;
applying a voltage between the donor substrate including the film of silicon material and the dielectric handle substrate to induce bonding between the surface region of the film of silicon material and the dielectric handle substrate; and
initiating a cleaving action to remove the film of silicon material using a propagating cleave front to form a multi-layered substrate, the method further comprising.
introducing a plurality of particles through a surface of the donor substrate into the donor substrate, wherein at least one of the plurality of particles remains in the film of silicon material after initiating the cleaving action.

45. A method for forming multilayered substrates for multi-layered substrates, the method comprising:
providing a donor substrate comprising an overlying a film of silicon material to be detached, the donor substrate having a cleave region formed within a vicinity of between the film of silicon material and a lower portion of the donor substrate;
coupling a surface region of the film of silicon material from the donor substrate to a dielectric handle substrate;
applying a voltage between the donor substrate including the film of silicon material and the dielectric handle substrate to induce bonding between the surface region of the film of silicon material and the dielectric handle substrate;
increasing a temperature of the donor substrate and the dielectric handle substrate to increase a global energy of the donor substrate and the dielectric handle substrate; and
initiating a cleaving action to remove the film of silicon material using a propagating cleave front to form a multi-layered substrate, the method further comprising
introducing a plurality of particles through a surface of the donor substrate into the donor substrate, wherein the plurality of particles includes hydrogen in combination with helium.

46. The method of claim 45 wherein at least one of the plurality of particles is derived from a source selected from the group consisting of hydrogen gas, helium gas, water vapor, methane, and hydrogen compounds.

47. The method of claim 45 wherein at least one of the plurality of particles is selected from the group consisting of neutral molecules, neutral atoms, charged molecules, charged atoms, and electrons.

48. The method of claim 45 wherein at least one of the plurality of particles is provided in the cleave region.

49. A method for forming multilayered substrates for multi-layered substrates, the method comprising:
providing a donor substrate comprising an overlying a film of silicon material to be detached, the donor substrate having a cleave region formed within a vicinity of between the film of silicon material and a lower portion of the donor substrate;
coupling a surface region of the film of silicon material from the donor substrate to a dielectric handle substrate;
applying a voltage between the donor substrate including the film of silicon material and the dielectric handle substrate to induce bonding between the surface region of the film of silicon material and the dielectric handle substrate;
increasing a temperature of the donor substrate and the dielectric handle substrate to increase a global energy of the donor substrate and the dielectric handle substrate; and
initiating a cleaving action to remove the film of silicon material using a propagating cleave front to form a multi-layered substrate, the method further comprising
introducing a plurality of particles through a surface of the donor substrate into the donor substrate, wherein the plurality of particles includes hydrogen in combination with a rare gas.

50. A method for forming multilayered substrates for multi-layered substrates, the method comprising:
providing a donor substrate comprising an overlying a film of silicon material to be detached, the donor substrate having a cleave region formed within a vicinity of between the film of silicon material and a lower portion of the donor substrate;
coupling a surface region of the film of silicon material from the donor substrate to a dielectric handle substrate;
applying a voltage between the donor substrate including the film of silicon material and the dielectric handle substrate to induce bonding between the surface region of the film of silicon material and the dielectric handle substrate;
increasing a temperature of the donor substrate and the dielectric handle substrate to increase a global energy of the donor substrate and the dielectric handle substrate; and
initiating a cleaving action to remove the film of silicon material using a propagating cleave front to form a multi-layered substrate, the method further comprising
introducing a first plurality of particles through a surface of the donor substrate into the donor substrate, wherein the first plurality of particles includes hydrogen in combination with helium, and
implanting a second plurality of particles through the surface of the donor substrate into the donor substrate.

51. The method of claim 50 wherein the second plurality of particles includes hydrogen.

52. The method of claim 50 wherein one of the first plurality of particles and the second plurality of particles includes hydrogen, and the other of the first plurality of particles and the second plurality of particles includes helium.

53. The method of claim 50 wherein one of the first plurality of particles and the second plurality of particles includes hydrogen, and the other of the first plurality of particles and the second plurality of particles includes a rare gas.

54. The method of claim 50 wherein a first particle of the first plurality of particles or a second particle of the second plurality of particles is derived from a source selected from the group consisting of hydrogen gas, helium gas, water vapor, methane, and hydrogen compounds.

55. The method of claim 50 wherein a first particle of the first plurality of particles or a second particle of the second plurality of particles is derived from a source selected from the group consisting of neutral molecules, neutral atoms, charged molecules, charged atoms, and electrons.

56. A method for forming multilayered substrates for multi-layered substrates, the method comprising:
providing a donor substrate comprising an overlying a film of silicon material to be detached, the donor substrate having a cleave region formed within a vicinity of between the film of silicon material and a lower portion of the donor substrate;
coupling a surface region of the film of silicon material from the donor substrate to a dielectric handle substrate;
applying a voltage between the donor substrate including the film of silicon material and the dielectric handle substrate to induce bonding between the surface region of the film of silicon material and the dielectric handle substrate;
increasing a temperature of the donor substrate and the dielectric handle substrate to increase a global energy of the donor substrate and the dielectric handle substrate; and initiating a cleaving action to remove the film of silicon material using a propagating cleave front to form a multi-layered substrate, the method further comprising, introducing a plurality of particles through a surface of the donor substrate into the donor substrate, wherein at least one of the plurality of particles remains in the film of silicon material after initiating the cleaving action.

* * * * *